United States Patent
Hata et al.

(10) Patent No.: US 8,421,102 B2
(45) Date of Patent: Apr. 16, 2013

(54) SEMICONDUCTOR LIGHT-EMITTING DEVICE HAVING A MEMBER IN A PERIPHERY MADE OF A MATERIAL WHOSE COLOR, TRANSPARENCY OR ADHESIVENESS CHANGES OVERTIME DUE TO LIGHT OR HEAT EMISSION FROM THE EMITTING ELEMENT

(75) Inventors: Toshio Hata, Osaka (JP); Nobuaki Aoki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 306 days.

(21) Appl. No.: 12/618,043

(22) Filed: Nov. 13, 2009

(65) Prior Publication Data
US 2010/0123151 A1 May 20, 2010

(30) Foreign Application Priority Data
Nov. 20, 2008 (JP) ................................ 2008-297141

(51) Int. Cl.
*H01L 29/267* (2006.01)

(52) U.S. Cl.
USPC ........ 257/98; 257/99; 257/100; 257/E33.001; 257/E51.018; 313/485

(58) Field of Classification Search ........... 257/E31.095, 257/98–100; 313/485
See application file for complete search history.

(56) References Cited

U.S. PATENT DOCUMENTS

| | | | |
|---|---|---|---|
| 6,429,583 B1* | 8/2002 | Levinson et al. ............. 313/503 |
| 6,683,325 B2* | 1/2004 | Waitl et al. ...................... 257/81 |
| 7,029,935 B2* | 4/2006 | Negley et al. .................. 438/29 |
| 7,319,289 B2* | 1/2008 | Suehiro et al. ................ 313/485 |
| 7,800,121 B2* | 9/2010 | Aanegola et al. ............... 257/98 |
| 2003/0038291 A1* | 2/2003 | Cao .................................. 257/81 |
| 2005/0212397 A1* | 9/2005 | Murazaki et al. ............. 313/487 |
| 2007/0274080 A1* | 11/2007 | Negley et al. ................. 362/341 |
| 2007/0295968 A1* | 12/2007 | Tan et al. ......................... 257/79 |
| 2008/0203413 A1 | 8/2008 | Schrank et al. |

FOREIGN PATENT DOCUMENTS

| JP | 2002-304904 | 10/2002 |
| JP | 2003-318447 | 11/2003 |
| JP | 2006-236636 | 9/2006 |

* cited by examiner

*Primary Examiner* — Anh Mai
(74) *Attorney, Agent, or Firm* — Nixon & Vanderhye, P.C.

(57) ABSTRACT

A light-emitting device in accordance with an embodiment of the present invention includes a semiconductor light-emitting element, and a member in the periphery of the semiconductor light-emitting element is made of a material whose color, transparency or adhesiveness changes over time as it is subjected to light or heat emitted by the semiconductor light-emitting element.

12 Claims, 12 Drawing Sheets

SEMICONDUCTOR LIGHT-EMITTING DEVICE HAVING A MEMBER IN A PERIPHERY MADE OF A MATERIAL WHOSE COLOR, TRANSPARENCY OR ADHESIVENESS CHANGES OVERTIME DUE TO LIGHT OR HEAT EMISSION FROM THE EMITTING ELEMENT

This application claims priority under 35 U.S.C. §119(a) on Patent Application No. 2008-297141 filed in Japan on Nov. 20, 2008, the entire contents of which are hereby incorporated herein by reference.

BACKGROUND OF THE INVENTION

1. Technical Field

The present invention relates to light-emitting devices for illumination or the like, using a semiconductor light-emitting element.

2. Background Art

Incandescent light bulbs, fluorescent lamps and high-pressure discharge lamps have been used conventionally as light sources for lighting fixtures or billboards. Research into light sources using semiconductor light emitting elements, such as LEDs, as new light sources replacing such conventional light sources, is advancing. These light sources using semiconductor light-emitting elements have the advantage that their lifetime is longer than that of conventional light sources, and they have raised high expectations as illumination light sources of the next generation.

Now, it is easy to observe the lifetime of conventional light sources. For example, when an incandescent light bulb has reached its lifetime, its filaments will break and it will no longer emit light, and what is more, when the light bulb is removed and shaken, the broken filaments will make a rattling noise, so that its lifetime can be clearly established. Moreover, in the case of fluorescent lamps, there will be a darkening near the electrodes due to the adherence of mercury, as well as flickering and lower brightness, so that also in this case it is easy to determine the lifetime.

On the other hand, even though semiconductor light-emitting elements, such as LEDs, have a much longer lifetime than incandescent light bulbs or fluorescent lamps, when they finally reach their lifetime and should be replaced, their characteristics, such as their emitted light amount, deteriorate only gradually, so that it is more difficult to observe their lifetime than that of incandescent light bulbs or fluorescent lamps. Accordingly, particular efforts are necessary to establish that the lifetime of the semiconductor light-emitting elements has come or is about to come.

Moreover, when a semiconductor light-emitting element, such as an LED, is used as an illumination light source, a plurality of semiconductor light-emitting elements are used, and it is necessary to consider differences in the individual lifetimes of the individual semiconductor light-emitting elements caused by differences in their solid-state characteristics.

The following is an explanation of devices described in JP 2002-304904A (referred to as Patent Document 1 below) and JP 2006-236636A (referred to as Patent Document 2 below), in which semiconductor light-emitting elements, such as LEDs, are used as illumination light sources.

The device of Patent Document 1 is configured as shown in FIGS. 11A and 11B. It comprises an LED power supply portion (not shown in the figures) that converts alternating current from a commercial power source into a low DC voltage of a predetermined level by down-stepping, rectifying and smoothing, and outputs this voltage, a main body 111, a fixture shell 112, an LED unit 113, and a lens body 114, for example. A plurality of light-emitting diodes (LEDs) are mounted on the LED unit 113. Lenses 114d that are positioned to the front side of the respective LEDs are arranged on the lens body 114. The LED unit 113 and the lens body 114 are stored removably in the main body 111 and the fixture shell 112, and exchange of the LED unit 113 is possible.

However, Patent Document 1 does not describe a method for determining when the lifetime of the LED unit has come, and states merely that the lifetime of the illumination device can be extended by exchanging the LED unit. Moreover, even though a plurality of LEDs are mounted on the LED unit, no consideration is given to differences among the lifetimes of the individual. LEDs.

The device of Patent Document 2 is configured as shown in FIGS. 12A and 12B. Here, the lighting fixture 121 includes a plurality of LED packages 122 serving as a light source. When the lighting fixture 121 approaches its predetermined lifetime, then the LED package 122 repeatedly lights up, and this lighting state of the LED package 122 is different from the ordinary lighting state, thereby announcing that its lifetime has come. The change in the lighting state of the LED package 122 can be easily and reliably perceived by a user of the lighting device 121.

More specifically, the driving power source (lighting device) includes a lighting circuit for letting the plurality of LED packages 122 light up, a control circuit that can control the lighting of each LED package 122 individually, a determination means for detecting a physical change that correlates with the predetermined lifetime of the lighting fixture 121 including the lifetime of the driving power source, and determining that the lifetime has come based on this, and a notification means for notifying that the lifetime is coming when the determination means has determined that the lifetime is coming.

The determination means detects for example characteristic values (electrostatic capacitance of an aluminum electrolytic capacitor, leak-current of a diode) of an electronic component within the power source for driving (light-emitting device) or the total lighting time of the LED packages 122, and determines that the lifetime is coming when these values exceed predetermined values.

When the determination means determines that the lifetime is coming, the notification means repeatedly turns the LED packages 122 on and off, and by changing the lighting state of the LED packages 122 with respect to the ordinary lighting state, the user can be notified of the fact that the lifetime of the lighting fixture 121 has come.

In Patent Document 2, the total lighting time of each LED package 122 is detected, so that the lifetime of each LED package 122 is detected and notified. However, it is necessary to provide a control means, a determination means and a notification means, so that the costs of the device become high.

Furthermore, the lifetime of the illumination device is taken as a precondition, and even though the total lighting time of each LED package 122 is detected, no consideration is given to differences in the lifetimes of the individual LED packages 122 caused by differences in the individual characteristics of the light sources.

SUMMARY OF THE INVENTION

Accordingly, it is an object of the present invention to overcome the above-described problems and to provide a light-emitting device that can indicate the lifetime of a semiconductor light-emitting element at low cost and individually.

A light-emitting device in accordance with the present invention is a light-emitting device including a semiconductor light-emitting element, wherein a member in the periphery of the semiconductor light-emitting element is made using a material whose color, transparency or adhesiveness changes over time as it is subjected to light or heat emitted by the semiconductor light-emitting element.

With this configuration, if the time that needs to pass until the color, transparency or adhesiveness of the peripheral member changes is set appropriately by selecting the material of that peripheral member, then it is possible to observe the time for exchanging the semiconductor light-emitting element based on the change in the color, transparency or adhesiveness of the peripheral member, when the lifetime of the semiconductor light-emitting element has come or immediately prior to the lifetime.

Also, the lifetime of the semiconductor light-emitting element can be indicated by simply selecting the material of the peripheral member, without a large increase in costs. Furthermore, in configurations in which a plurality of semiconductor light-emitting elements are used, the peripheral member of each semiconductor light-emitting element should be made using a material whose color, transparency or adhesiveness changes over time, so that even when there are differences in the lifetimes due to the differences in the individual characteristics of the semiconductor light-emitting elements, it is possible to indicate the lifetimes of the semiconductor light-emitting elements individually.

In the light-emitting device according to the present invention, there is a difference in the change over time in color, transparency or adhesiveness due to light or heat emitted by the semiconductor light-emitting element, between the member in the periphery of the semiconductor light-emitting element and another peripheral member besides the peripheral member.

With this configuration, it is possible to clearly recognize the change of the member in the periphery of the semiconductor light-emitting element by comparing it to the other member in the periphery of the semiconductor light-emitting element.

In the light-emitting device according to the present invention, a time after which the color, transparency or adhesiveness of the member in the periphery of the semiconductor light-emitting element changes may be shorter than a lifetime of the semiconductor light-emitting element.

With this configuration, it is possible to reliably observe the time to exchange the semiconductor light-emitting element based on the change in color, transparency or adhesiveness of the peripheral member. Giving consideration to the specific lifetime of the semiconductor light-emitting element, the time after which the color, transparency or adhesiveness of the member in the periphery of the semiconductor light-emitting element changes may be 20,000 to 150,000 hours, for example.

In the light-emitting device according to the present invention, the member in the periphery of the semiconductor light-emitting element may be arranged on an optical axis of the semiconductor light-emitting element.

With this configuration, it is possible to cause the change over time in the peripheral member by reliably irradiating the peripheral member with light emitted from the semiconductor light-emitting element.

In the light-emitting device according to the present invention, the member in the periphery of the semiconductor light-emitting element may be arranged in a location that is visible from outside the light-emitting device.

With this configuration, it is easy to visually confirm the change in color or transparency of the peripheral member.

In the light-emitting device according to the present invention, the member in the periphery of the semiconductor light-emitting element may be made of at least one selected from the group consisting of epoxy resin, acrylic resin, imide resin, phenolic resin, silicone resin, norbornene resin, polymethyl pentene resin, amorphous nylon resin, polyarylate and polycarbonate resin.

In the light-emitting device according to the present invention, the color, transparency or adhesiveness of the member in the periphery of the semiconductor light-emitting element may change over time due to the photocatalytic action caused by the light emitted by the semiconductor light-emitting element.

In the light-emitting device according to the present invention, the semiconductor light-emitting element may be an LED whose emission color is blue or violet.

In the light-emitting device according to the present invention, the member in the periphery of the semiconductor light-emitting element may be a translucent sealing resin sealing the semiconductor light-emitting element, and the color, transparency or adhesiveness of at least a portion of this translucent sealing resin may change over time as it is subjected to the light or heat emitted by the semiconductor light-emitting element.

With this configuration, if the color or the transparency of at least a portion of the translucent sealing resin changes over time due to being subjected to light or heat emitted from the semiconductor light-emitting element, then the color or brightness of the light emitted after passing through the translucent sealing resin changes together with the change over time of the color or transparency of the translucent sealing resin, because the light from the semiconductor light-emitting element is emitted after passing through the translucent sealing resin. Therefore, it is possible to observe the lifetime of the semiconductor light-emitting element based on the change in color or brightness of this light.

Moreover, the adhesiveness of at least a portion of the translucent sealing resin may deteriorate due to the change over time, and at least a portion of the translucent sealing resin may detach and fall off from the location where it is adhered.

With this configuration, it is also possible to indicate the lifetime of the semiconductor light-emitting element with fragments of the translucent sealing resin that have detached and fallen off.

Furthermore, at least a portion of the translucent sealing resin may be bonded with a wire to the semiconductor light-emitting element.

With this configuration, when at least a portion of the translucent sealing resin detaches and falls off, the wire of the semiconductor light-emitting element is broken. Thus, the semiconductor light-emitting element stops to emit light and it is possible to indicate the lifetime of the semiconductor light-emitting element.

In the light-emitting device according to the present invention, the member in the periphery of the semiconductor light-emitting element may be a translucent cover covering the semiconductor light-emitting element, and the color, transparency or adhesiveness of at least a portion of this translucent cover may change over time as it is subjected to the light emitted by the semiconductor light-emitting element.

With this configuration, the light from the semiconductor light-emitting element is emitted after passing through the translucent cover, so that the color and brightness of the light that is emitted after passing through the translucent cover changes together with the change over time of the color or transparency of the translucent cover. Therefore, it is possible to observe the lifetime of the semiconductor light-emitting element based on the change in color or brightness of this light.

In this case, the adhesiveness of a portion of the translucent cover may deteriorate due to the change over time, and this portion may detach and fall off inside the translucent cover.

With this configuration, the adhesiveness of a portion of the translucent cover deteriorates due to the change over time, and this portion detaches and falls off inside the translucent cover, so that the lifetime of the semiconductor light-emitting element can also be indicated through the fragments that have detached and fallen off.

The portion of the translucent cover whose color or transparency changes may be arranged such that it encloses an optical axis of the semiconductor light-emitting element.

In this configuration, the portion of the translucent cover whose color or transparency changes may be arranged such that it encloses an optical axis of the semiconductor light-emitting element, so that the color and the brightness of the light in the periphery changes without changing the color and the brightness of the light in the direction of the optical axis.

The portion of the translucent cover whose color or transparency changes may render letters, symbols or graphics.

With this configuration, it is possible to display a message indicating that the lifetime has come, the lifetime time, a company name, a product name or the like.

In the light-emitting device according to the present invention, a translucent cover covering the semiconductor light-emitting element may be provided, and the adhesiveness of the member in the periphery of the semiconductor light-emitting element may deteriorate due to the change over time, and the member in the periphery of the semiconductor light-emitting element may detach and fall off inside the translucent cover.

With this configuration, fragments that have detached and fallen off inside the translucent cover cast a shadow when the semiconductor light-emitting element emits light, which is easy to visually confirm, or, when the light-emitting device is shaken, it emits a noise of the collision inside the translucent cover, so that it is easy to observe the lifetime of the semiconductor light-emitting element.

In the light-emitting device according to the present invention, the member in the periphery of the semiconductor light-emitting element may be a fluorescent material that is mixed into a translucent sealing resin sealing the semiconductor light-emitting element, and the fluorescent color of at least some of the fluorescent material may change over time as it is subjected to light or heat emitted from the semiconductor light-emitting element.

With this configuration, it is possible to observe the lifetime of the semiconductor light-emitting element based on the change in the fluorescent color of the fluorescent material that is mixed into the translucent sealing resin.

In the light-emitting device according to the present invention, a translucent cover covering the semiconductor light-emitting element may be provided, the member in the periphery of the semiconductor light-emitting element may be a fluorescent material that is mixed into the translucent cover, and the fluorescent color of at least some of the fluorescent material may change over time as it is subjected to light or heat emitted from the semiconductor light-emitting element.

With this configuration, it is possible to observe the lifetime of the semiconductor light-emitting element based on the change in the fluorescent color of the fluorescent material that is mixed into the translucent cover.

In the light-emitting device according to the present invention, the member in the periphery of the semiconductor light-emitting element may be a primer that is applied to the semiconductor light-emitting element or to a substrate on which the semiconductor light-emitting element is mounted, and the color, transparency or adhesiveness of the primer may change over time as it is subjected to light or heat emitted from the semiconductor light-emitting element.

With this configuration, the light of the semiconductor light-emitting element is emitted after passing through the primer, so that the color or brightness of the light that is emitted after passing through the primer changes together with the change over time of the color or transparency of the primer. Therefore, it is possible to observe the lifetime of the semiconductor light-emitting element based on this change in the color or brightness of the light.

In this case, when the primer changes over time as it is subjected to light or heat emitted from the semiconductor light-emitting element, a member in contact with the primer and containing Ag may change in color.

In the light-emitting device according to the present invention, the member in the periphery of the semiconductor light-emitting element may be a substrate on which the semiconductor light-emitting element is mounted, and the color of at least a portion of the substrate may change over time as it is subjected to light or heat emitted from the semiconductor light-emitting element.

With this configuration, it is possible to observe the lifetime of the semiconductor light-emitting element based on the change in the color of the substrate.

In the light-emitting device according to the present invention, the member in the periphery of the semiconductor light-emitting element may be a base supporting a substrate of the semiconductor light-emitting element, and the color of at least a portion of the base may change over time as it is subjected to light or heat emitted from the semiconductor light-emitting element.

With this configuration, it is possible to observe the lifetime of the semiconductor light-emitting element based on the change in the color of the base.

In the light-emitting device according to the present invention, the member in the periphery of the semiconductor light-emitting element may be a die-bonding paste with which the semiconductor light-emitting element is die-bonded onto a substrate, and the adhesiveness of the die-bonding paste may change over time as it is subjected to light or heat emitted from the semiconductor light-emitting element.

In this case, the adhesiveness of the die-bonding paste with which the semiconductor light-emitting element is die-bonded onto the substrate may deteriorate due to the change over time, so that the semiconductor light-emitting element detaches from its adhesion location and falls off.

With this configuration, the wires of the semiconductor light-emitting element break off and the semiconductor light-emitting element stops to emit light, so that the lifetime of the semiconductor light-emitting element is indicated.

DESCRIPTION OF THE PREFERRED EMBODIMENTS

The following is a description of the preferred embodiments of the invention, with reference to the accompanying drawings.

First Embodiment

Figure 1A:
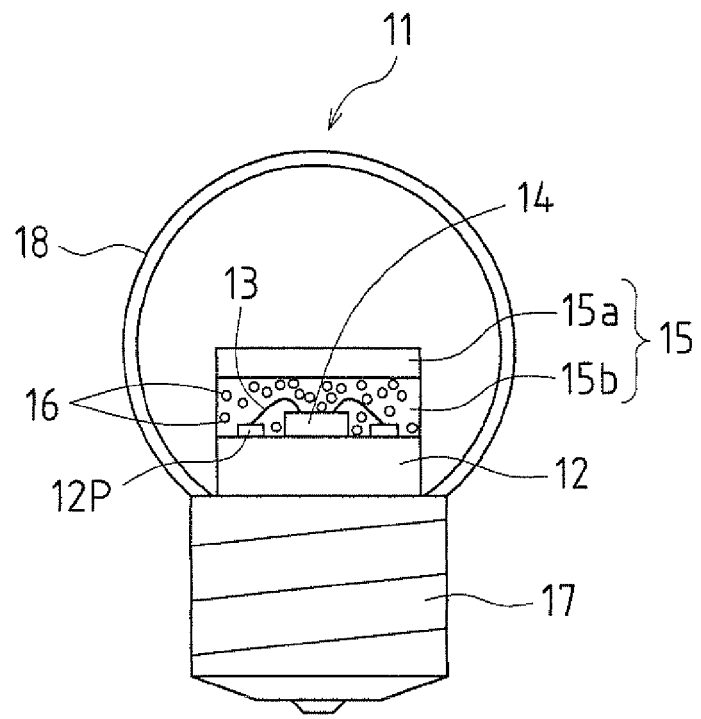
FIG. 1A is a longitudinal sectional view showing a light-emitting device according to a first embodiment of the present invention.

FIG. 1A is a longitudinal sectional view showing a light-emitting device according to a first embodiment of the present invention. As shown in FIG. 1A, a light-emitting device 11 according to the first embodiment includes a substrate 12, a semiconductor light-emitting element 14 mounted on the substrate 12, a translucent sealing resin 15 sealing the semiconductor light-emitting element 14 on the substrate 12, a base 17 supporting the substrate 12, and a translucent cover 18 covering the space above the base 17.

An alumina substrate having a high optical reflectance for visible light is used as the substrate 12. The size of the substrate 12 can be for example 2.0 mm×1.6 mm length by width, with a thickness of 0.3 mm.

The semiconductor light-emitting element 14 is die-bonded with die-bonding paste onto the substrate 12 and connected by bondwires 13 to a wiring pattern 12P formed on the substrate 12. This semiconductor light-emitting element 14 is a blue LED (light emitting diode) having its main light emission peak in the blue wavelength region between 400 nm and 500 nm, for example.

The translucent sealing resin 15 is about 0.7 mm thick and provides a resin seal of the substrate 12 and the semiconductor light-emitting element 14. The light of the semiconductor light-emitting element 14 is emitted through the translucent sealing resin 15.

This translucent sealing resin 15 has a layered structure of a second sealing resin 15b whose color and transparency hardly change over time even when it is subjected to light or heat from the semiconductor light-emitting element 14, and a first sealing resin 15a whose color and transparency change over time when it is subjected to light or heat from the semiconductor light-emitting element 14.

Here, a phenyl-based silicone resin is used as the second sealing resin 15b and an epoxy resin is used as the first sealing resin 15a.

The second sealing resin 15b is 0.4 mm thick and its surface is substantially flat and parallel to the surface of the substrate 12. The first sealing resin 15a is layered on top of the surface of the second sealing resin 15b.

The first sealing resin 15a is 0.3 mm thick and after forming and curing the phenyl-based silicone resin serving as the second sealing resin 15b, the epoxy resin serving as the first sealing resin 15a is formed and cured on top of the surface of the second sealing resin 15b. Since it is not advisable to expose the phenyl-based silicone resin before curing to an epoxy atmosphere, the epoxy resin is injected and cured after curing the silicone resin. The surface of the first sealing resin 15a is parallel to the surface of the substrate 12 and is substantially flat.

Moreover, the second sealing resin 15b includes a fluorescent material 16. As the fluorescent material 16, a yellow fluorescent material with 5 μm average particle diameter having a high luminous efficacy, such as Eu:BOSE or ROSE (europium-activated strontium-barium-orthosilicate, $(Ba,Sr)_2SiO_4:Eu$) is used. This fluorescent material 16 absorbs blue light that is emitted from the semiconductor light-emitting element 14 and emits yellow fluorescent light having a light emission peak in the wavelength region between 550 nm and 600 nm. White light, which is a combination of the blue light from the semiconductor light-emitting element 14 and the yellow light from the fluorescent material 16, is radiated from the light-emitting device 11.

Such a device, in which the semiconductor light-emitting element 14 is mounted on the substrate 12 and the substrate 12 and the semiconductor light-emitting element 14 are resin-sealed by the translucent sealing resin 15 is called a "chip LED". This chip LED is mounted on the base 17 to which the translucent cover 18 is attached.

The base 17 includes a chip LED mounting portion, a heat dissipation portion and external electrical contacts. The external electrical contacts have the shape of the cap of a light bulb and are plated with gold. The upper end of the base 17 is connected to the aperture at the lower side of the translucent cover 18, the gap between the two is sealed shut, and the space above the base 17 is covered by the translucent cover 18.

The translucent cover 18 is made of an acrylic resin. Alternatively, using a silicone resin with high heat resistance instead of the acrylic resin is even more preferable.

This light-emitting device 11 has a height of 25 mm and diameter of 10 mm.

Moreover, with this embodiment, all members except for the semiconductor light-emitting element 14 are peripheral members, and of these, the first sealing resin 15a is the peripheral member made of a material that changes over time.

Next, a process for manufacturing the light-emitting device 11 is explained. A plurality of semiconductor light-emitting elements 14 are mounted by die-bonding in an array arrangement on a large substrate. Then, a phenyl silicone resin (into which the fluorescent substance 16 has been kneaded) is injected by air dispension, and the silicone resin is cured by pressing a die against it and heat-pressing, forming the second sealing resin 15b. Then, epoxy resin is injected by air dispension, and the epoxy resin is cured by pressing a die against it and heat-pressing, forming the first sealing resin 15a.

After this, the large substrate is diced, and cut into a plurality of substrates 12, each having a semiconductor light-emitting element 14 mounted on them. Thus, a chip LED is formed, in which the semiconductor light-emitting element 14 is mounted on the substrate 12, and the substrate 12 and the semiconductor light-emitting element 14 are resin-sealed by a translucent sealing resin 15.

This chip LED is mounted on the base 17. Then, acrylic resin is sequentially injected by the dispension method into a two-part die in which molding spaces for a plurality of translucent covers 18 are formed in a row, and a plurality of bases 17, each having a chip LED mounted on it, are held lined up in a row at equal pitch as the aperture portions of these molding spaces. The bases 17 that are lined up in a row at equal pitch as the apertures of the molding spaces are filled up to a certain position with respect to the aperture portions of the molding spaces of the dies, the upper edge of the bases 17 is connected to the aperture portions made of acrylic resin of the molding spaces of the dies, and the acrylic resin of the molding spaces of the dies is cured. Then, the two-part die is parted, and the translucent covers 18 are retrieved from the molding spaces of the die. In this state, the upper edges of the bases 17 are connected to the apertures of the translucent covers 18, and thus a plurality of light-emitting devices 11 are completed.

In such a light-emitting device 11, when the light emission time of the semiconductor light-emitting element 14 exceeds a predetermined time, then its luminosity deteriorates considerably, and it is possible to ascertain that the lifetime of the semiconductor light-emitting element 14 has come.

The first sealing resin 15a is an epoxy resin, as noted above, and when it is subjected to light or heat from the semiconductor light-emitting element 14, its color and transparency change over time. And when the total time it has been subjected to light or heat reaches about 40,000 hours, which is less than the predetermined time of the lifetime of the semiconductor light-emitting element 14, the first sealing resin 15a deteriorates and its color changes from colorless transparent to dark brown. Thus, the luminosity of the light-emitting element 11 decreases sharply and the light emission color of the light-emitting device 11 changes considerably, so that it is possible to indicate that the lifetime of the semiconductor light-emitting element 14 has come.

Moreover, it is possible to indicate the lifetime of the semiconductor light-emitting element 14 through a simple selection of the material of the first sealing resin 15a, without a large increase in costs. Furthermore, if a plurality of light-emitting devices 11 are used, it is possible to indicate the lifetimes of the semiconductor light-emitting elements 14 individually, since the first sealing resin 15a is provided separately for each semiconductor light-emitting element 14.

It should be noted that the first sealing resin 15a may not only be made of a material such that the color or transparency of the first sealing resin 15a changes due to its deterioration over time, but it may also be made of such a material that it loses its adhesiveness to the second sealing resin 15b and it detaches and falls off. In this case, the luminosity of the light-emitting device 11 suddenly recovers, or in other words it becomes brighter due to the peeling off at the places whose color has changed. Moreover, since the first sealing resin 15a whose color has changed falls off within the translucent cover 18, during light emission of the semiconductor light-emitting element 14, the first sealing resin 15a throws a shadow against the translucent cover 18, which is easy to confirm visually, or, when the light-emitting device 11 is shaken, it emits a noise of the collision of the first sealing resin 15a within the translucent cover 18, thus indicating the lifetime of the semiconductor light-emitting element 14. Here, the translucent cover 18 is hollow and there is space around the chip LED, so that it is easy to perceive the falling off of the first sealing resin 15a. Moreover, in order to make an increase or decrease in the brightness of the light-emitting device 11 or a change in color of the first sealing resin 15a easier to determine, it is preferable to use, for the translucent cover 18, a material with high transparency.

The second sealing resin 15b is a rectangular cuboid of approximately the same size as the substrate 12, but other shapes, such as a cylindrical shape are also possible.

Furthermore, the second sealing resin 15a does not include a fluorescent substance, but it may also include a fluorescent substance. The first sealing resin 15a can be formed at any position on the second sealing resin 15b, but it is preferably directly above the semiconductor light-emitting element 14, that is, on the optical axis of the semiconductor light-emitting element 14.

Moreover, one semiconductor light-emitting element 14 is mounted on one substrate 12, but it is also possible to mount a plurality of semiconductor light-emitting elements 14, or to mount a plurality of chip LEDs on one base 17.

Figure 1B:
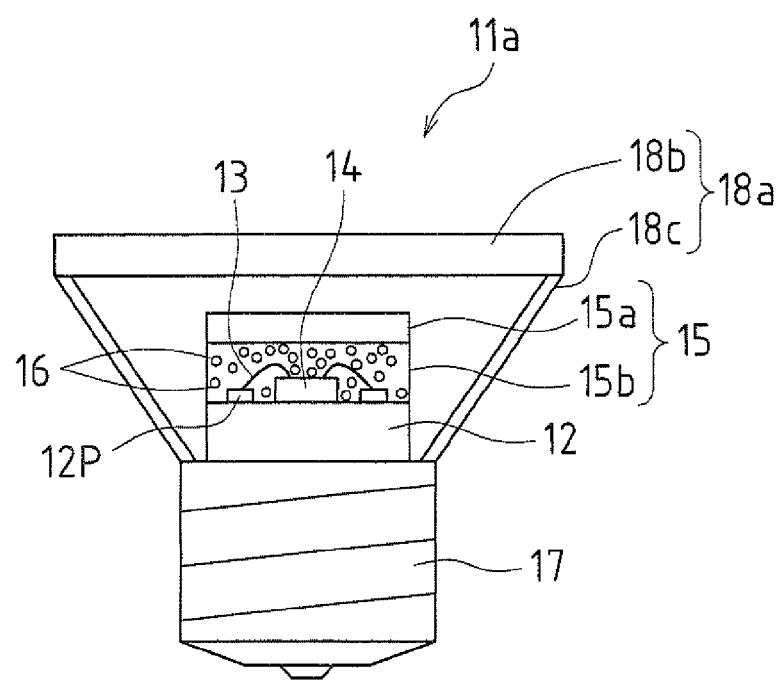
FIG. 1B is a longitudinal sectional view showing a modified example of the light-emitting device of FIG. 1A.

FIG. 1B is a longitudinal sectional view showing a modified example of the light-emitting device of FIG. 1A. In the light-emitting device 11a of this modified example, a cover 18a is provided instead of the translucent cover 18 of FIG. 1A, and the light-emitting device 11a has the shape of a spot-type LED light. Other structural members, such as the substrate 12, the semiconductor light-emitting element 14, the translucent sealing resin 15, the base 17 and so on are similar as in the light-emitting device 11 of FIG. 1A, but their size, shape, number, material, composition and the like may also be changed as appropriate.

The cover 18a includes a lateral portion 18c having the shape of an up-side-down truncated cone and a planar portion 18b disposed above the semiconductor light-emitting element 14.

The lateral portion 18c having the shape of an up-side-down truncated cone has aperture portions at its top and its bottom, the upper edge of the base 17 is connected to the lower aperture portion, whereas the planar portion 18b is fitted to the upper aperture portion.

The lateral portion 18c having the shape of an up-side-down truncated cone is non-transparent and has on its inner wall a plating layer that reflects light.

The planar portion 18b is a transparent plate, so that light from the semiconductor light-emitting element 14 is emitted through the planar portion 18b to the outside.

Second Embodiment

Figure 2:
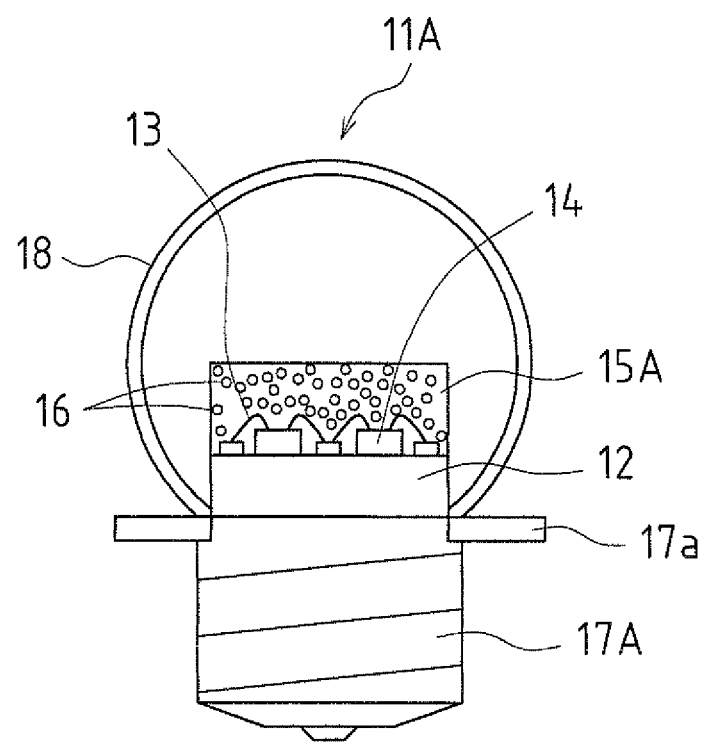
FIG. 2 is a longitudinal sectional view showing a light-emitting device according to a second embodiment of the present invention.

FIG. 2 is a longitudinal sectional view showing a light-emitting device according to a second embodiment of the present invention. It should be noted that in FIG. 2, the same reference numerals are assigned to elements fulfilling the same function as those in FIG. 1A, and their further explanation has been omitted.

As shown in FIG. 2, a light-emitting device 11A according to the second embodiment includes a substrate 12, a plurality of semiconductor light-emitting elements 14 mounted on the substrate 12, a translucent sealing resin 15 sealing the semiconductor light-emitting elements 14 on the substrate 12, a base 17A supporting the substrate 12, and a translucent cover 18 covering the space above the base 17A.

The substrate 12 is an alumina substrate similar to the one in FIG. 1A and having a larger size than that of FIG. 1A, namely 3.0 mm×2.0 mm length by width, and a thickness of 0.3 mm.

The translucent sealing resin 15A has a single-layer structure with a thickness of about 0.7 mm, and resin-seals the substrate 12 and the semiconductor light-emitting elements 14. The light of the semiconductor light-emitting elements 14 is emitted through the translucent sealing resin 15A.

This translucent sealing resin 15A is a polycarbonate resin whose color, transparency and adhesiveness change over time, as it is subjected to light or heat from the semiconductor light-emitting elements 14.

The surface of the translucent sealing resin 15A is approximately planar and parallel to the surface of the substrate 12. Furthermore, a fluorescent substrate 16 is mixed into the translucent sealing resin 15A.

This device, in which the semiconductor light-emitting elements 14 are mounted on the substrate 12, and the substrate 12 and the semiconductor light-emitting elements 14 are resin-sealed by the translucent sealing resin 15A is a chip LED.

Besides a chip LED mounting portion, a heat dissipation portion and external electrical contacts, the base 17A includes heat dissipation fins 17a. The heat dissipation fins 17a receive the heat generated by the semiconductor light-emitting elements 14 of the chip LED by thermal conduction and dissipate this heat.

The translucent cover 18 is made of a silicone resin having a high heat resistance.

The process for manufacturing such a light-emitting device 11A is similar to that for the light-emitting device 11 of FIG. 1A. A plurality of semiconductor light-emitting elements 14 are mounted by die-bonding in an array arrangement on a large substrate. Then, a polycarbonate resin is injected by air dispension, and the polycarbonate resin is cured by pressing a die against it and heat-pressing, forming the translucent sealing resin 15A. Then, the large substrate is diced, and cut into a plurality of substrates 12, each having a semiconductor light-emitting element 14 mounted on them, thus forming a plurality of chip LEDs. The chip LED is mounted on the base 17A, the translucent cover 18 is molded with a die and, at the same time, the upper edge of the base 17A is connected to the aperture portion of the translucent cover 18, thus completing the light-emitting device 11A.

In such a light-emitting device 11A, when the light emission time of the semiconductor light-emitting elements 14 exceeds a predetermined time, then its luminosity deteriorates considerably, and it is possible to ascertain that the lifetime of the semiconductor light-emitting elements 14 has come.

As mentioned above, the translucent sealing resin 15A is a polycarbonate resin, and when it is subjected to light or heat from the semiconductor light-emitting elements 14, its color, transparency and adhesiveness change over time. And when the total time it has been subjected to light or heat reaches about 50,000 hours, which is less than the predetermined time of the lifetime of the semiconductor light-emitting elements 14, the translucent sealing resin 15A deteriorates and its color changes from colorless transparent to yellowish brown. Thus, the luminosity of the light-emitting element 11A decreases sharply and the light emission color of the light-emitting device 11A changes considerably, so that it is possible to indicate that the lifetime of the semiconductor light-emitting element 14 has come.

Also, when the total time it has been subjected to light or heat reaches about 50,000 hours, the adhesiveness of the translucent sealing resin 15 deteriorates, so that the translucent sealing resin 15A detaches and falls off from the substrate 12. There is sufficient space provided between the inner wall of the translucent cover 18 and the translucent sealing resin 15A, so that the translucent sealing resin 15A falls off reliably. As becomes clear from FIG. 2, the translucent sealing resin 15A is formed such that it encloses the bondwires 13 of the semiconductor light-emitting element 14, so that when the translucent sealing resin 15A detaches and falls off, the bondwires 13 are broken off, so that the semiconductor light-emitting element 14 stops emitting light and the lifetime of the semiconductor light-emitting elements 14 is more reliably indicated.

Moreover, the translucent cover 18 is made of a silicone resin, so that even when the deterioration of the translucent sealing resin 15A is immense, the chip LED can be protected from outside, and it furthermore serves the effect of magnifying and clearly showing the color change of the translucent sealing resin portion 15A through a lens effect.

Moreover, it is possible to indicate the lifetime of the semiconductor light-emitting element 14 through a simple selection of the material of the translucent sealing resin 15A, without a large increase in costs. Furthermore, if a plurality of light-emitting devices 11A are used, it is possible to indicate the lifetimes of the semiconductor light-emitting elements 14 individually, since the translucent sealing resin 15A is provided separately for each semiconductor light-emitting element 14.

It should be noted that the translucent sealing resin 15A is a rectangular cuboid of approximately the same size as the substrate 12, but it may also have another shape, for example a cylindrical shape.

It is preferable that the translucent sealing resin 15A is arranged directly above the semiconductor light-emitting element 14, that is, on the optical axis of the semiconductor light-emitting element 14.

Moreover, it is possible to mount a plurality of chip LEDs on one base 17A.

Third Embodiment

Figure 3A:
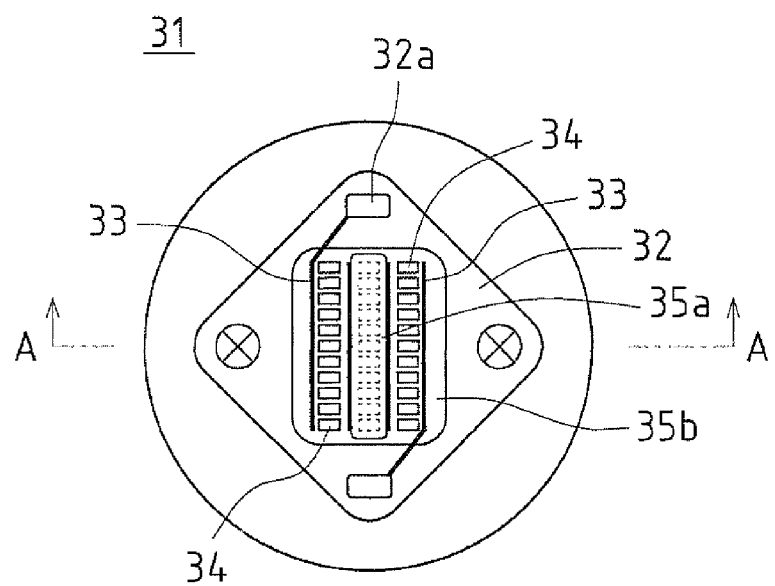
FIG. 3A is a plan view showing a light-emitting device according to a third embodiment of the present invention.
Figure 3B:
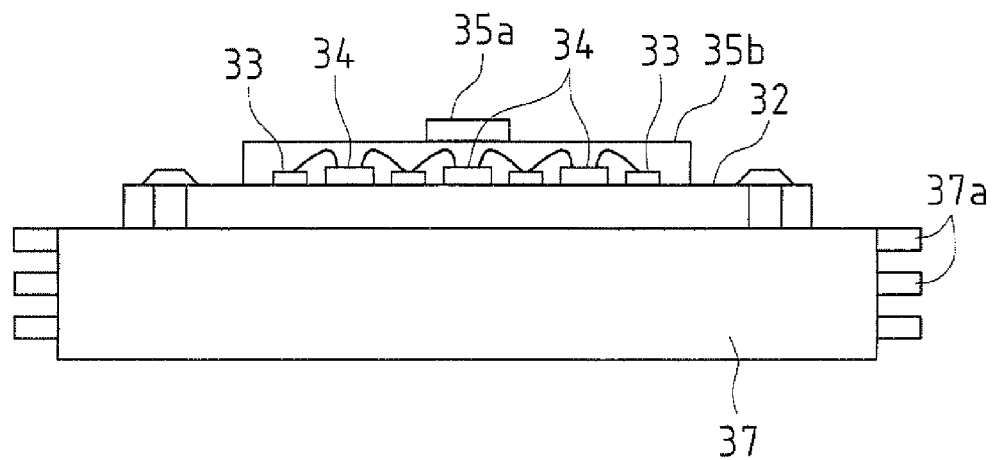
FIG. 3B is a longitudinal sectional view of the light-emitting device taken along the line A-A in FIG. 3A.

FIG. 3A is a plan view showing a light-emitting device according to a third embodiment of the present invention and FIG. 3B is a longitudinal sectional view taken along the line A-A in that plan view.

As shown in FIGS. 3A and 3B, the light-emitting device 31 according to the third embodiment includes a substrate 32, semiconductor light-emitting elements 34 mounted on the substrate 32, a second sealing resin 35b sealing the semiconductor light-emitting element 34 on the substrate 32, and a base 37 supporting the substrate 32.

The substrate 32 is an alumina substrate made of 95% alumina. Its size is 18.0 mm×18.0 mm length by width, with a thickness of 1.5 mm.

Screw holes for attaching the substrate 32 to the base 37 are formed on both ends of the substrate 32. A wiring pattern 33 of parallel wirings is formed on the substrate 32, a plurality of, namely three rows of 10 to 20 semiconductor light-emitting elements 34 are mounted between the wirings of the wiring pattern 33, and the terminals of the semiconductor light-emitting elements 34 are connected through the wiring pattern 33 to respective pad portions 32a on the substrate 32.

Moreover, the semiconductor light-emitting elements 34 and a portion of the substrate 32 are resin-sealed by the second sealing resin 35b, whereas a first sealing resin 35a is layered on top of a portion of the second sealing resin 35b. The first sealing resin 35a covers only an area corresponding to the semiconductor light-emitting elements 34 in the middle row.

Both the first and the second sealing resins 35a and 35b have a surface that is substantially flat and parallel to the surface of the substrate 32.

Moreover, both the first and the second sealing resins 35a and 35b are translucent. The second sealing resin 35b covers all semiconductor light-emitting elements 34, so that the light of all semiconductor light-emitting elements 34 is emitted through the second sealing resin 35b. Moreover, the first sealing resin 35a covers only the semiconductor light-emitting elements 34 of the middle row, so that only the light from the semiconductor light-emitting elements 34 of the middle row is emitted through the first sealing resin 35a.

The first sealing resin 35a is made of an acrylic resin of about 0.2 mm thickness, and when it is subjected to light or heat from the semiconductor light-emitting elements 34, its color and transparency change over time. Moreover, the second sealing resin 35b is made of a dimethyl-silicone resin of 0.3 mm thickness, and its color and transparency hardly change over time, even when it is subjected to light or heat from the semiconductor light-emitting elements 34.

Also both of the first and second sealing resins 35a and 35b include a fluorescent substance 34 (not shown in the figures) that absorbs the light from the semiconductor light-emitting elements 34 and emits at a wavelength that is different from the light of the semiconductor light-emitting elements 34.

The base 37 is made of aluminum and includes fins 37a for increasing heat dissipation.

Such a light-emitting device 31 can be used as a light source of a light fixture (not shown in the figures). This light-emitting device 31 is mounted in the light fixture, the pads 32a on the substrate 32 of the light-emitting device 31 are connected by soldering to a power line of the light fixture, and power is supplied from the pads 32a on the substrate 32 through the wirings of the wiring pattern 33 to the semiconductor light-emitting elements 34, thus causing the semiconductor light-emitting elements 34 to emit light. The connection between the pads 32a of the light-emitting device 31 and the power line of the light fixture can also be accomplished with detachable connectors, making it possible to exchange the light-emitting device 31.

In such a light-emitting device 31, when the light emission time of the semiconductor light-emitting elements 34 exceeds a predetermined time, then its luminosity deteriorates considerably, and it is possible to ascertain that the lifetime of the semiconductor light-emitting elements 34 has come.

As mentioned above, the first sealing resin 35a is an acrylic resin, and when it is subjected to light or heat from the semiconductor light-emitting elements 34, its color and transparency change over time. And when the total time it has been subjected to light or heat reaches about 30,000 hours, which is less than the predetermined time of the lifetime of the semiconductor light-emitting elements 34, the first sealing resin 35a deteriorates and its color changes from colorless transparent to brown. Thus, the luminosity of the light-emitting device 31 decreases and the light emission color of the light-emitting device 31 changes, so that it is possible to indicate that the lifetime of the semiconductor light-emitting elements 34 has come.

Moreover, it is possible to indicate the lifetime of the semiconductor light-emitting elements 34 through a simple selection of the material of the first sealing resin 35a, without a large increase in costs.

Figure 4:
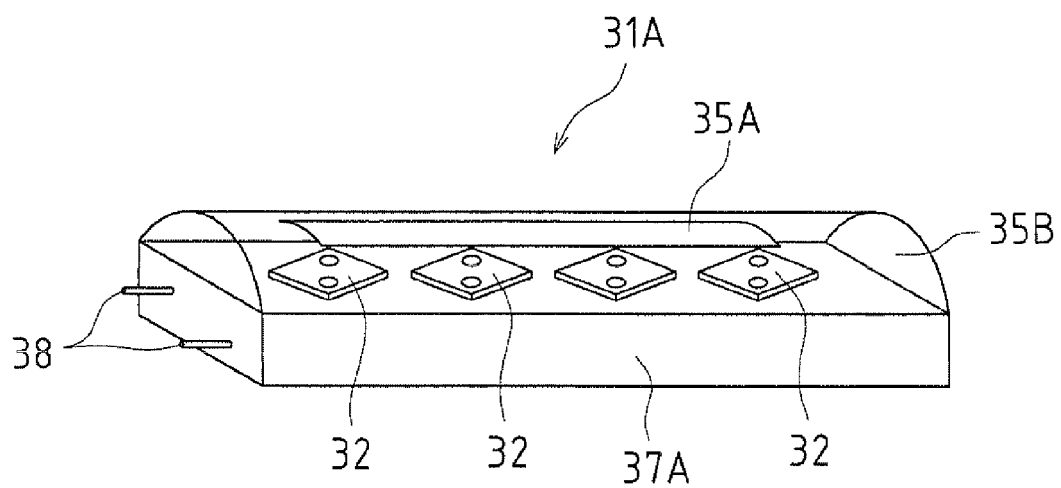
FIG. 4 is a perspective view showing a modified example of the light-emitting device shown in FIGS. 3A and 3B.

FIG. 4 is a perspective view showing a modified example of the light-emitting device shown in FIGS. 3A and 3B. It should be noted that in FIG. 4, the same reference numerals are assigned to elements fulfilling the same function as those in FIGS. 3A and 3B.

In the light-emitting device 31A of this modified example, a plurality of substrates 32 are mounted in a row of a rectangular plate-shaped base 37A, the substrates 32 and the semiconductor light-emitting elements 34 (not shown in the drawing) on the substrates 32 are sealed by a half-cylindrical second sealing resin 35B, and a first sealing resin 35A is layered on the apex of the second sealing resin 35B, arranging the first sealing resin 35A above the semiconductor light-emitting elements 34 of each of the substrates 32.

A pair of connection terminals 38 protrude from the end surface of the base 37A, and by inserting these connection terminals 38 into a socket (not shown in the figures), power is supplied from a power line on the side of the socket through the connection terminals 38 to the semiconductor light-emitting elements 34 on the substrates 32, and light is emitted by the semiconductor light-emitting elements 34.

In such a light-emitting device 31A, when the light emission time of the semiconductor light-emitting elements 34 exceeds a predetermined time, then its luminosity deteriorates considerably, and it is possible to ascertain that the lifetime of the semiconductor light-emitting elements 34 has come.

The first sealing resin 35A is made of an acrylic resin, and when it is subjected to light or heat from the semiconductor light-emitting elements 34, its color and transparency change over time. And when the total time it has been subjected to light or heat reaches about 30,000 hours, which is less than the predetermined time of the lifetime of the semiconductor light-emitting elements 34, the first sealing resin 35A deteriorates and its color changes from colorless transparent to brown. Thus, the luminosity of the light-emitting device 31A decreases sharply and the light emission color of the light-emitting device 31A changes, so that it is possible to indicate that the lifetime of the semiconductor light-emitting elements 34 has come. What is more, the first sealing resin 35A arranged over the semiconductor light-emitting elements 34 of the substrates 32 has an oblong rectangular shape, so that the change of color is easy to confirm visually and it is possible to ascertain the lifetime of the semiconductor light-emitting elements 34 with the same sense as with a fluorescent lamp, in which there is a color change near the electrodes and flickering.

Fourth Embodiment

Figure 5A:
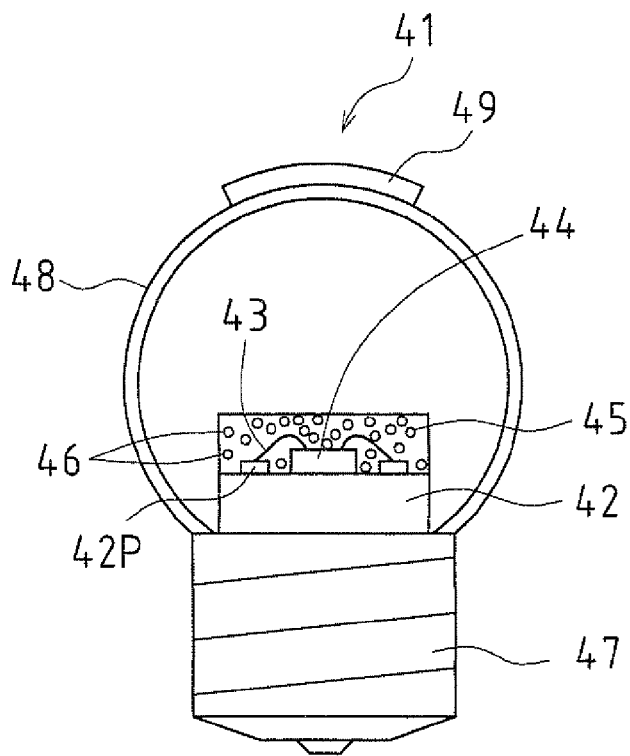
FIG. 5A is a longitudinal sectional view showing a light-emitting device according to a fourth embodiment of the present invention.

FIG. 5A is a longitudinal sectional view showing a light-emitting device according to a fourth embodiment of the present invention. As shown in FIG. 5A, a light-emitting device 41 according to the fourth embodiment includes a substrate 42, a semiconductor light-emitting element 44 mounted on the substrate 42, a translucent sealing resin 45 sealing the semiconductor light-emitting element 44 on the substrate 42, a base 47 supporting the substrate 42, and a translucent cover 48 covering the space above the base 47.

An alumina substrate having a high optical reflectance for visible light is used as the substrate 42. The size of the substrate 42 can be for example 2.6 mm×1.6 mm length by width, with a thickness of 0.35 mm.

The semiconductor light-emitting element 44 is die-bonded with die-bonding paste onto the substrate 42 and connected by bondwires 43 to a wiring pattern 42P formed on the substrate 42. This semiconductor light-emitting element 44 is a blue LED (light emitting diode) having its main light emission peak in the blue wavelength region between 400 nm and 500 nm, for example.

The translucent sealing resin 45 is about 0.35 mm thick, and its surface is substantially flat and parallel to the surface of the substrate 42, resin-sealing the substrate 42 and the semiconductor light-emitting element 44. The light from the semiconductor light-emitting element 44 is emitted through the translucent sealing resin 45.

The translucent sealing resin 45 is made of a silicone resin whose color and transparency hardly change over time, even when it is subjected to light or heat from the semiconductor light-emitting element 44.

Moreover, the translucent sealing resin 45 includes a fluorescent material 46. As the fluorescent material 46, a green light-emitting fluorescent material that is made of a divalent europium-activated oxynitride fluorescent material that is a β-SiAlON that can be substantially represented by the general formula $Eu_aSi_bAl_cO_dN_e$, having a high luminous efficacy, and a red light-emitting fluorescent material that is made of a divalent europium-activated nitride fluorescent material that can be substantially represented by the general formula $(MI_{1-f}Eu_f)MIISiN_3$ (where MI represents at least one element selected from Mg, Ca, Sr and Ba and MII represents at least one element selected from Al, Ga, In, Sc, Y, La, Gd and Lu) was used. This fluorescent material 46 absorbs green light emitted from the semiconductor light-emitting element 44 and emits red fluorescent light having an emission peak in the wavelength region between 600 nm and 750 nm as well as green fluorescent light having an emission peak in the wavelength region between 490 nm and 600 nm. The light-emitting device 41 emits white light with a high color rendering property obtained by mixing the blue light from the semiconductor light-emitting element 44 with the red fluorescent light and the green fluorescent light from the fluorescent material 46.

In this manner, the semiconductor light-emitting element 44 is mounted on the substrate 42, and a chip LED is formed in which the substrate 42 and the semiconductor light-emitting element 44 are resin-sealed by the translucent sealing resin 45. This chip LED is mounted on the base 47, and the translucent cover 48 is attached to the base 47.

The base 47 includes a chip LED mounting portion, a heat dissipation portion and external electrical contacts. The upper end of the base 47 is connected to the aperture at the lower side of the translucent cover 48, the gap between the two is sealed shut, and the space above the base 47 is covered by the translucent cover 48.

The translucent cover 48 is made of an acrylic resin. Alternatively, using a silicone resin with high heat resistance instead of the acrylic resin is even more preferable. A translucent resin piece 49 is glued to a portion of the external surface of the translucent cover 48. This translucent resin piece 49 is a polycarbonate resin whose color, transparency and adhesiveness change over time when it is subjected to the light or heat from the semiconductor light-emitting element 44, and formed and cured with a thickness of 0.5 mm on the external surface of the translucent cover 48, after forming and curing the translucent cover 48. Consequently, the inner surface of the translucent resin piece 49 has the same curved surface as the external surface of the translucent cover 48, and is formed in one piece with the translucent cover 48.

This light-emitting device 41 has a height of 24 mm and diameter of 18 mm.

Next, a process for manufacturing the light-emitting device 41 is explained. A plurality of semiconductor light-emitting elements 44 are mounted by die-bonding in an array arrangement on a large substrate. Then, an acrylic resin or a silicone resin (into which the fluorescent substance 46 has been kneaded) is injected by air dispension, and the resin is cured by pressing a die against it and heat-pressing, forming the translucent sealing resin 45.

After this, the large substrate is diced, and cut into a plurality of substrates 42, each having a semiconductor light-emitting element 44 mounted on them. Thus, a chip LED is formed, in which the semiconductor light-emitting element 44 is mounted on the substrate 42, and the substrate 42 and the semiconductor light-emitting element 44 are resin-sealed by the translucent sealing resin 45.

This chip LED is mounted on the base 47. Then, acrylic resin is sequentially injected by the dispension method into a two-part die in which molding spaces for a plurality of translucent covers 48 are formed in a row, and a plurality of bases 47, each having a chip LED mounted on it, is held lined up in a row at equal pitch as the aperture portions of these molding spaces. The bases 47 that are lined up in a row at equal pitch as the apertures of the molding spaces are filled up to a certain position with respect to the aperture portions of the molding spaces of the dies, the upper edges of the bases 47 are connected to the aperture portions made of acrylic resin of the molding spaces of the dies, and the acrylic resin of the molding spaces of the dies is cured. Then, the two-part die is parted, and the translucent covers 48 are retrieved from the molding spaces of the die. In this situation, the upper edge of the bases 47 are connected to the aperture portions of the translucent covers 48, and translucent resin pieces 49 are formed and cured with a mask on a portion of the external surface of these translucent covers 48, thus completing a plurality of light-emitting devices 41.

In such a light-emitting device 41, as mentioned above, the translucent resin piece 49 of the translucent cover 48 is made of a polycarbonate resin whose color, transparency and adhesiveness changes over time when it is subjected to light or heat from the semiconductor light-emitting element 44. And when the total time it has been subjected to light or heat reaches about 40,000 to 50,000 hours, which is less than the predetermined time of the lifetime of the semiconductor light-emitting element 44, the translucent resin piece 49 deteriorates and its color changes from colorless transparent to dark brown. Thus, the luminosity of the light-emitting device 41 decreases sharply and the light emission color of the light-emitting device 41 changes considerably, so that it is possible to indicate that the lifetime of the semiconductor light-emitting element 44 has come.

Moreover, when the translucent resin piece 49 deteriorates, and detaches and falls off from the surface of the translucent cover 48, then the external appearance of the light-emitting device 41 changes considerably, so that it is possible to indicate more reliably that the lifetime of the semiconductor light-emitting element 44 has come.

Moreover, it is possible to indicate the lifetime of the semiconductor light-emitting element 44 by merely selecting the material of the translucent resin piece 49, without a large increase in costs. Furthermore, if a plurality of light-emitting devices 41 are used, it is possible to indicate the lifetimes of the semiconductor light-emitting elements 44 individually, since the translucent resin piece 49 is provided separately for each semiconductor light-emitting element 44.

It should be noted that it is also possible to provide the translucent resin piece 49 on the inner surface of the translucent cover 48 instead of on the external surface of the translucent cover 48. In this case, the translucent resin piece 49 detaches and falls off from the inner surface of the translucent cover 48 to the inner side of the translucent cover 48, so that the translucent resin piece 49 casts a shadow against the translucent cover 48 during light emission of the semiconductor light-emitting element 44, which is easy to confirm visually, or, when the light-emitting device 41 is shaken, it emits a noise of the collision of the translucent resin piece 49 within the translucent cover 48, thus indicating the lifetime of the semiconductor light-emitting element 44.

The translucent resin piece 49 is a rectangular cuboid of approximately the same size as the substrate 42, but other shapes, such as a cylindrical shape are also possible.

It is preferable that the translucent resin piece 49 is arranged directly above the semiconductor light-emitting element 44, that is, on the optical axis of the semiconductor light-emitting element 44, but as long as the amount of light it receives from the semiconductor light-emitting element 44 is not lowered too much, it may also be arranged at a position away from the optical axis.

Moreover, one semiconductor light-emitting element 44 is mounted on one substrate 42, but it is also possible to mount a plurality of semiconductor light-emitting elements 44, or to mount a plurality of chip LEDs on one base 47.

Figure 5B:
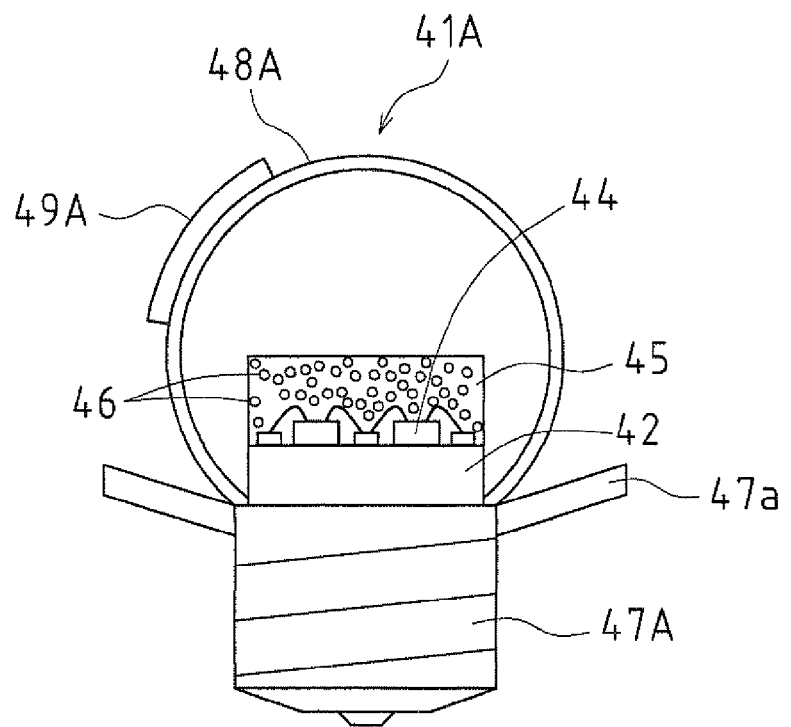
FIG. 5B is a longitudinal sectional view showing a modified example of the light-emitting device of FIG. 5A.
Figure 5C:
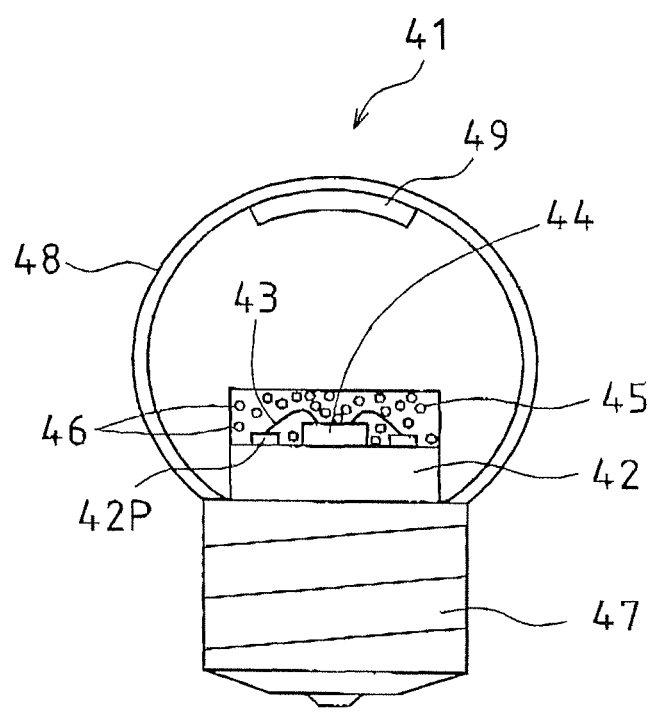
FIG. 5C is a longitudinal sectional view showing a modified example of the light-emitting device of FIG. 5A.

FIG. 5B is a longitudinal sectional view showing a modified example of the light-emitting device of FIG. 5A. The light-emitting device 41A of this modified example includes a substrate 42, a plurality of semiconductor light-emitting elements 44 mounted on the substrate 42, a translucent sealing resin 45 sealing the semiconductor light-emitting element 44 on the substrate 42, a base 47A supporting the substrate 42, and a translucent cover 48A covering the space above the base 47A.

The substrate 42 is an alumina substrate similar to the one in FIG. 5A and having a larger size than that of FIG. 5A, namely 3.0 min×2.0 mm length by width, with a thickness of 0.3 mm.

The semiconductor light-emitting elements 44 and the translucent sealing resin 45 are the same as those in FIG. 5A. A fluorescent material 46 is mixed into the translucent sealing resin 45.

Besides a chip LED mounting portion, a heat dissipation portion and external electrical contacts, the base 47A includes heat dissipation fins 47a. The heat dissipation fins 47a receive the heat generated by the semiconductor light-emitting elements 44 and dissipate this heat.

The translucent cover 48A is made of an acrylic resin or a silicone resin. A translucent resin piece 49A is glued to a portion of the external surface of the translucent cover 48A. This translucent resin piece 49A is a polycarbonate resin whose color, transparency and adhesiveness change over time when it is subjected to the light or heat from the semiconductor light-emitting elements 44, and formed and cured with a thickness of 0.5 mm on the external surface of the translucent cover 48A, after forming and curing this translucent cover 48A.

In this light-emitting device 41A, the translucent resin piece 49A is not arranged directly above the semiconductor light-emitting elements 44, that is, it is not on the optical axis of the semiconductor light-emitting elements 44, but the translucent resin piece 49A is arranged at a position that is removed from the optical axis of the semiconductor light-emitting elements 44, so that the amount of light it receives from the semiconductor light-emitting elements 44 is slightly reduced. The position at which the translucent resin piece 49A is arranged is set under the condition that the translucent resin piece 49A is easy to confirm visually when the light-emitting device 41A is viewed from the outside. Thus, the reduction in luminosity and the change in the light emission color of the light-emitting device 41A accompanying the deterioration of the translucent resin piece 49A will not be overlooked.

It should be noted that it is also possible to provide the translucent resin piece 49A on the inner surface of the translucent cover 48A instead of on the external surface of the translucent cover 48A, such that the translucent resin piece 49A detaches and falls off to the inner side of the translucent cover 48A.

Fifth Embodiment

Figure 6A:
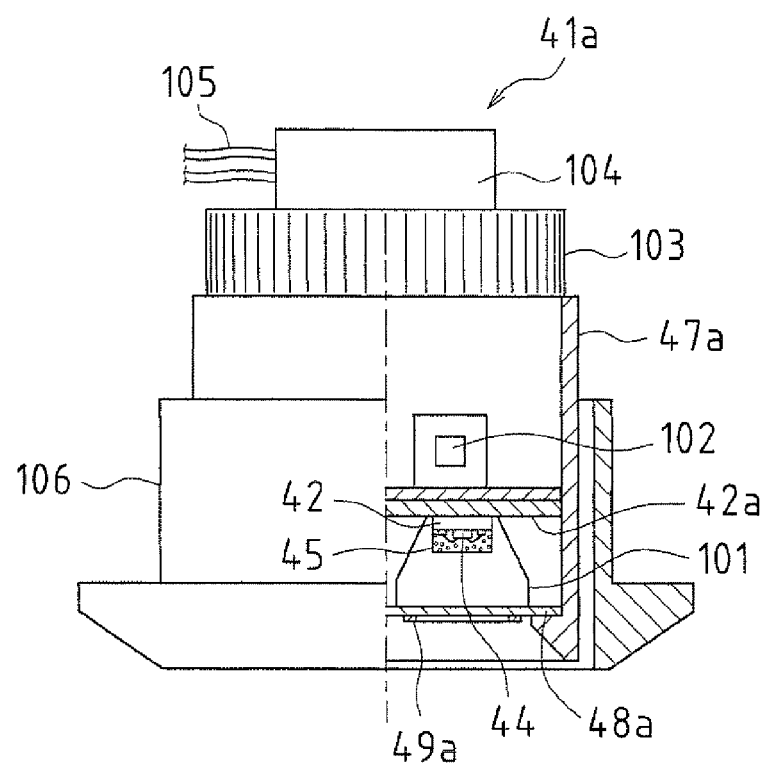
FIG. 6A is a longitudinal sectional view of a light-emitting device according to a fifth embodiment of the present invention.
Figure 6B:
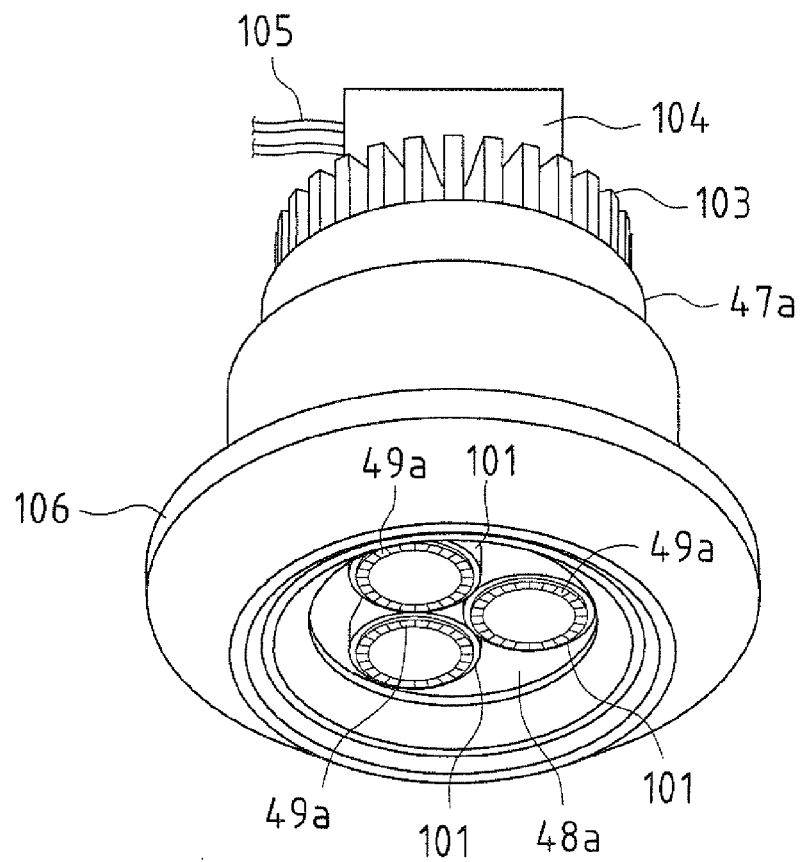
FIG. 6B is a perspective view of a light-emitting device according to a fifth embodiment of the present invention.

FIGS. 6A and 6B are a longitudinal sectional view and a perspective view of a light-emitting device according to a fifth embodiment of the present invention. It should be noted that in FIGS. 6A and 6B, the same reference numerals are assigned to elements fulfilling the same function as those in FIG. 5A.

As shown in FIGS. 6A and 6B, a light-emitting device 41a according to the sixth embodiment can be used as a downlight. A substrate 42a is fixed to the inner side of a cylindrical base 47a, three reflective members 101 with truncated cone shape are arranged on the lower side of the substrate 42a, semiconductor light-emitting elements 44 are mounted respectively to the inner side of these reflective members 101, and a cylindrical translucent cover 48a closes the aperture at the lower side of the cylindrical base 47a shut. A power source circuit 102 is mounted on the upper side of the substrate 42a, and heat dissipation fins 103 are provided at the aperture on the upper side of the cylindrical base 47a. A terminal portion 104 is arranged above these heat dissipation fins 103, and a power cord 105 is led out from the terminal portion 104. Furthermore, an outer jacket member 106 is provided around the lower side of the cylindrical base 47a.

In the light-emitting device 41a of this embodiment, ring-shaped translucent resin pieces 49a are provided on the lower face of the translucent cover 48a for each of the three semiconductor light-emitting elements 44. When the light-emitting device 41a is viewed from below, the ring-shaped translucent resin pieces 49 provided for each of the three semiconductor light-emitting elements 44 are respectively arranged such that they enclose the optical axis of the semiconductor light-emitting elements 44.

In this configuration, when the translucent resin pieces 49a deteriorate as they are subjected to light or heat from the semiconductor light-emitting elements 44, the peripheral luminosity decreases and the brightness gradient is reduced without decreasing the luminosity in the frontal direction of the light-emitting device 41a, even though their color changes from colorless transparent to dark brown.

It should be noted that instead of the ring-shaped translucent resin pieces 49a, it is also possible to provide a plurality of translucent resin pieces discretely, such that they surround the optical axis of the semiconductor light-emitting elements 44. If a plurality of translucent resin pieces 49a are arranged surrounding the semiconductor light-emitting elements 44, then it is also possible form the translucent resin pieces 49a into letters, symbols or graphics, so that a message indicating that the lifetime has come, the lifetime time, a company name, a product name or the like is displayed.

It is also possible to provide a large ring-shaped translucent resin piece or a plurality of translucent resin pieces surrounding all semiconductor light-emitting elements 44 on the lower side of the translucent cover 48a. It is also possible to provide translucent resin pieces on the upper side of the translucent cover 48.

Sixth Embodiment

Figure 7:
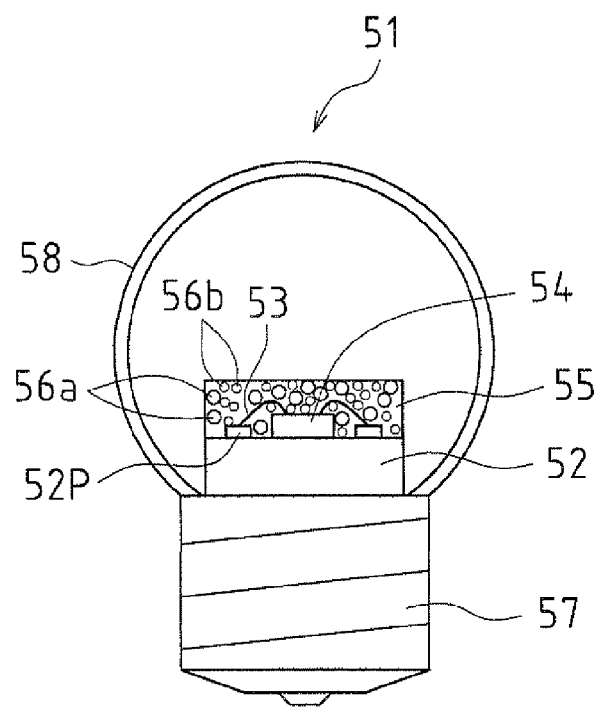
FIG. 7 is a longitudinal sectional view showing a light-emitting device according to a sixth embodiment of the present invention.

FIG. 7 is a longitudinal sectional view showing a light-emitting device according to a sixth embodiment of the present invention. As shown in FIG. 7, a light-emitting device 51 according to the sixth embodiment includes a substrate 52, a semiconductor light-emitting element 54 mounted on the substrate 52, a translucent sealing resin 55 sealing the semiconductor light-emitting element 54 on the substrate 52, a base 57 supporting the substrate 52, and a translucent cover 58 covering the space above the base 57.

For the substrate 52, an alumina substrate is used that has a high optical reflectance for visible light. The size of the substrate 52 is for example 2.0 mm×1.6 mm length by width, with a thickness of for example 0.3 mm.

The semiconductor light-emitting element 54 is die-bonded with die-bonding paste onto the substrate 52 and connected by bondwires 53 to a wiring pattern 52P formed on the substrate 52. This semiconductor light-emitting element 54 is an LED (light emitting diode) having its main light emission peak in the ultraviolet wavelength region between 250 nm and 400 nm, for example.

The translucent sealing resin 55 is about 0.6 mm thick and provides a resin seal of the substrate 52 and the semiconductor light-emitting element 54. The light of the semiconductor light-emitting element 54 is emitted through the translucent sealing resin 55.

This translucent sealing resin 55 is an additionally cured silicone rubber whose color, transparency and adhesiveness hardly change over time, even when it is subjected to ultraviolet light from the semiconductor light-emitting element 54. The surface of the translucent sealing resin 55 is substantially flat and parallel to the surface of the substrate 52.

The translucent sealing resin 55 contains a first fluorescent material 56a and a second fluorescent material 56b. Here, the first fluorescent material 56a is a blue fluorescent material of $BaMgAl_{10}O_{17}:Eu^{2+}$ with an average particle size of 6 μm, and the second fluorescent material 56b is a yellow fluorescent material of Eu:BOSE (europium-activated strontium barium orthosilicate, $(Ba,Sr)_2SiO_4:Eu$) with an average particle size of 8 μl. The first and the second fluorescent materials 56a and 56b absorb ultraviolet light emitted from the semiconductor light-emitting element 54, and emit blue light having an emission peak in a wavelength region between 400 nm and 500 nm as well as yellow light having an emission peak in the wavelength region between 550 nm and 600 nm. The light-emitting device 51 emits white light mixing the blue light and the yellow light.

When the time for which the first fluorescent material 56a is subjected to the ultraviolet light of the semiconductor light-emitting element 54 reaches about 60,000 hours, then the first fluorescent material 56a deteriorates, and the amount of blue fluorescent light decreases. Also, the second fluorescent material 56b hardly deteriorates at all at an irradiation time of about 60,000 hours, so that the amount of yellow fluorescent light does not decrease.

In this manner, the semiconductor light-emitting element 54 is mounted on the substrate 52, and a chip LED is formed in which the substrate 52 and the semiconductor light-emitting element 54 are resin-sealed by the translucent sealing resin 55. This chip LED is mounted on the base 57, and the translucent cover 58 is attached to the base 57.

The base 57 includes a chip LED mounting portion, a heat dissipation portion and external electrical contacts. The upper end of the base 57 is connected to the aperture at the lower side of the translucent cover 58, the gap between the two is sealed shut, and the space above the base 57 is covered by the translucent cover 58.

The process for manufacturing such a light-emitting device 51 is similar to that for the light-emitting device 11 of FIG. 1A. A plurality of semiconductor light-emitting elements 54 are mounted by die-bonding in an array arrangement on a large substrate. Then, an additionally cured silicon rubber (into which the first and second fluorescent materials 56a and 56b have been kneaded) is injected by air dispension, and the silicone rubber is cured by pressing a die against it and heat-pressing, forming the translucent sealing resin 55. Then, the large substrate is diced, and cut into a plurality of substrates 52, each having a semiconductor light-emitting element 54 mounted on them, thus forming a plurality of chip LEDs. A chip LED is mounted on the base 57, the translucent cover 58 is molded with a die and at the same time, the upper edge of the base 57 is connected to the aperture portion of the translucent cover 58, thus completing the light-emitting device 51.

In this light-emitting device 51, as mentioned above, the first and second fluorescent materials 56a and 56b are mixed into the translucent sealing resin 55, and when the time they are subjected to ultraviolet light from the semiconductor light-emitting element 54 reaches about 60,000 hours, which is less than the predetermined time of the lifetime of the semiconductor light-emitting element 54, the amount of blue fluorescent light from the first fluorescent material 56a is reduced, but the amount of yellow fluorescent light from the second fluorescent material 56b is not reduced. Therefore, when the light emission time of the semiconductor light-emitting element 54 reaches about 60,000 hours, the amount of yellow fluorescent light from the second fluorescent material 56b becomes relatively stronger, and the illumination light of the light-emitting device 51 changes to yellowish light. Thus, it is possible to indicate that the lifetime of the light-emitting device 51 has come.

Moreover, it is possible to indicate the lifetime of the semiconductor light-emitting element 54 through a simple selection of the material of the fluorescent material, without a large increase in costs. Furthermore, if a plurality of light-emitting devices 51 are used, it is possible to indicate the lifetimes of the semiconductor light-emitting elements 54 individually, since the translucent sealing resin 55 is provided separately for each semiconductor light-emitting element 54.

It should be noted that it is also possible to select as the first fluorescent material 56a, which is supposed to indicate the lifetime of the light-emitting device 51, a fluorescent material whose fluorescent wavelength changes when it is used for a predetermined time.

Moreover, the translucent sealing resin 55 is a rectangular cuboid of approximately the same size as the substrate 52, but it may also have another shape, for example a cylindrical shape.

Moreover, one semiconductor light-emitting element 54 is mounted on one substrate 52, but it is also possible to mount a plurality of semiconductor light-emitting elements 54, or to mount a plurality of chip LEDs on one base 57.

It is also possible to mix the first and second fluorescent materials 56a and 56b into the translucent cover 58 instead of into the translucent sealing resin 55. In this case, the ultraviolet light of the semiconductor light-emitting element 54 is converted into visible light by the translucent cover 58. Then, when the time for which it has been subjected to the ultraviolet light from the semiconductor light-emitting element 54 reaches about 60,000 hours, the amount of blue fluorescent light from the first fluorescent material 56a contained in the translucent cover 58 is reduced, so that the illumination light of the light-emitting device 51 changes to yellowish light, indicating that the lifetime of the light-emitting device 51 has come.

Seventh Embodiment

Figure 8:
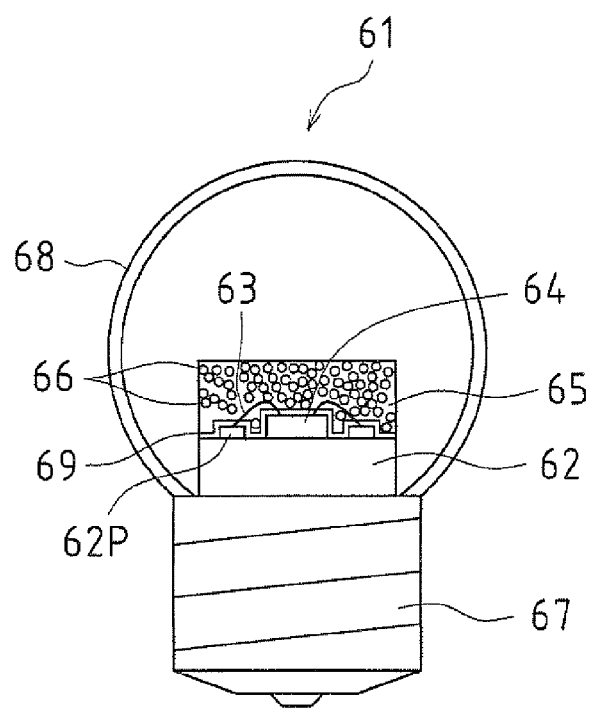
FIG. 8 is a longitudinal sectional view showing a light-emitting device according to a seventh embodiment of the present invention.

FIG. 8 is a longitudinal sectional view showing a light-emitting device according to a seventh embodiment of the present invention. As shown in FIG. 8, the light-emitting device 61 of the seventh embodiment includes a substrate 62, a semiconductor light-emitting element 64 mounted on the substrate 62, a primer 69 applied on top of the substrate 62 and the semiconductor light-emitting element 64, a translucent sealing resin 65 layered on the primer 69, a base 67 supporting the substrate 62, and a translucent cover 68 covering the space above the base 67.

As the substrate 62, an LTCC substrate (glass/Ag/ceramic with thermal vias) with high thermal conductivity and reflectivity is used. The size of the substrate 62 is for example 2.0 mm×2.0 mm length by width, with a thickness of 0.4 mm.

The semiconductor light-emitting element 64 is die-bonded with die-bonding paste onto the substrate 62 and connected by bondwires 63 to a wiring pattern 62P formed on the substrate 62. This semiconductor light-emitting element 64 is a blue LED having its main light emission peak in the blue wavelength region between 400 nm and 500 nm, for example.

The primer 69 is an epoxy-based resin, which is injected and cured by the dispension method such that it covers the semiconductor light-emitting element 64 and forms a layer of 0.1 mm thickness. The primer 69 deteriorates as it is subjected to heat from the semiconductor light-emitting element 64, and when the total time it has been subjected to this heat reaches about 50,000 hours, the color of the primer 69 changes from colorless transparent to tan-colored.

The translucent sealing resin 65 is about 0.5 mm thick and is layered on the primer 69. This translucent sealing resin 65 is made of an organic modified silicone resin whose surface is substantially flat and parallel to the surface to the substrate 62.

The translucent sealing resin 65 contains a fluorescent material 66. Here, the fluorescent material 66 is $(Y_{1-x}Sm_x)_3(Al_yGa_{1-y})_5O_{12}:Ce$ (where $0 \leq x < 1$, $0 \leq y < 1$), a so-called YAG yellow fluorescent material. Its average particle diameter is 10 μm. This yellow fluorescent material absorbs blue light from the semiconductor light-emitting element 64, and emits yellow light having an emission peak in a wavelength region between 550 nm and 600 nm. The light-emitting device 61 emits white light obtained by mixing the blue light and the yellow light.

In this manner, a chip LED in which the semiconductor light-emitting element 64 is mounted on the substrate 62 is mounted on the base 67, and the translucent cover 68 is attached to the base 67.

The upper end of the base 67 is connected to the aperture at the lower side of the translucent cover 68, the gap between the two is sealed shut, and the space above the base 67 is covered by the translucent cover 68.

The process for manufacturing such a light-emitting device 61 is similar to that for the light-emitting device 11 of FIG. 1A. A plurality of semiconductor light-emitting elements 64 are mounted by die-bonding in an array arrangement on a large substrate. Then, the primer 69 is injected by air dispension and cured, and then an organic modified silicone resin (containing the fluorescent material 66) is injected by air dispension and the organic modified silicone resin is cured, forming the translucent sealing resin 65. Then, the large substrate is diced, and cut into a plurality of substrates 62, each having a semiconductor light-emitting element 64 mounted on them, thus forming a plurality of chip LEDs. A chip LED is mounted on the base 67, the translucent cover 68 is molded with a die and at the same time, the upper edge of the base 67 is connected to the aperture portion of the translucent cover 68, thus completing the light-emitting device 61.

In this light-emitting device 61, as mentioned above, the primer 69 is made of an epoxy resin whose color changes from colorless transparent to tan-colored when it is subjected to heat from the semiconductor light-emitting element 64. When the total time for which the primer 69 is subjected to heat reaches about 50,000 hours, which is less than the predetermined time of the lifetime of the semiconductor light-emitting element 64, the color of the primer 69 changes from colorless transparent to tan-colored. Thus, the luminosity of the light-emitting device 61 drops sharply, the emission color of the light-emitting device 61 changes considerably, and it is possible to indicate that the lifetime of the semiconductor light-emitting element 64 has come.

Moreover, it is possible to indicate the lifetime of the semiconductor light-emitting element 64 through a simple selection of the material of the primer 69, without a large increase in costs. Furthermore, if a plurality of light-emitting devices 61 are used, it is possible to indicate the lifetimes of the semiconductor light-emitting elements 64 individually, since the translucent primer 69 is provided separately for each semiconductor light-emitting element 64.

If the primer 69 detaches due to deterioration and the translucent sealing resin 65 falls off together with the primer 69, then the bondwires 63 contained in the translucent sealing resin 65 are broken off, so that the semiconductor light-emitting element 64 stops emitting light and the lifetime of the semiconductor light-emitting element 64 is even more reliably indicated.

The primer 69 deteriorates due to heat generated by the semiconductor light-emitting element 64, and this deterioration advances faster the higher the heat is. And the heat generated by the semiconductor light-emitting element 64 increases the larger the current flowing through the semiconductor light-emitting element 64 is. On the other hand, the lifetime of the semiconductor light-emitting element 64 is said to vary with an increase in crystal defects inside the element due to current flowing through it, and there is a tendency that the lifetime of the semiconductor light-emitting element 64 becomes shorter the larger the current is. Consequently, it seems that the deterioration of the primer 69 attached firmly to the semiconductor light-emitting element 64 and the lifetime of the semiconductor light-emitting element 64 correlate with each other. In illumination devices in which many chip LEDs are mounted, even when there is a variation between the current amounts flowing through the chip LEDs (variation in the lifetime), the primer 69 and the semiconductor light-emitting element 64 deteriorate together in accordance with the current amount, so that it is possible to indicate the lifetime of the semiconductor light-emitting element 64 through the deterioration of the primer 69 for each chip LED individually. That is to say, even when there are differences in the lifetime due to differences in the individual properties of the semiconductor light-emitting elements 64, it is possible to indicate the lifetimes of the various semiconductor light-emitting elements 64 individually.

Moreover, one semiconductor light-emitting element 64 is mounted on one substrate 62, but it is also possible to mount a plurality of semiconductor light-emitting elements 64, or to mount a plurality of chip LEDs on one base 67.

It is also possible to apply a primer in order to increase the adhesive contact at the location where the base 67 contacts the translucent cover 68, and to indicate that the lifetime of the semiconductor light-emitting element 64 has come through a change in color of this primer. In this case, it is easy to confirm visually the change in color of the primer through the translucent cover 68.

It is furthermore possible to provide a structure in which the substrate 61 with an Ag/alumina configuration is covered by the primer 69. In this case, the Ag oxidizes and becomes black as the primer 69 deteriorates. Thus, it becomes even easier to determine that the lifetime has come.

Eighth Embodiment

Figure 9:
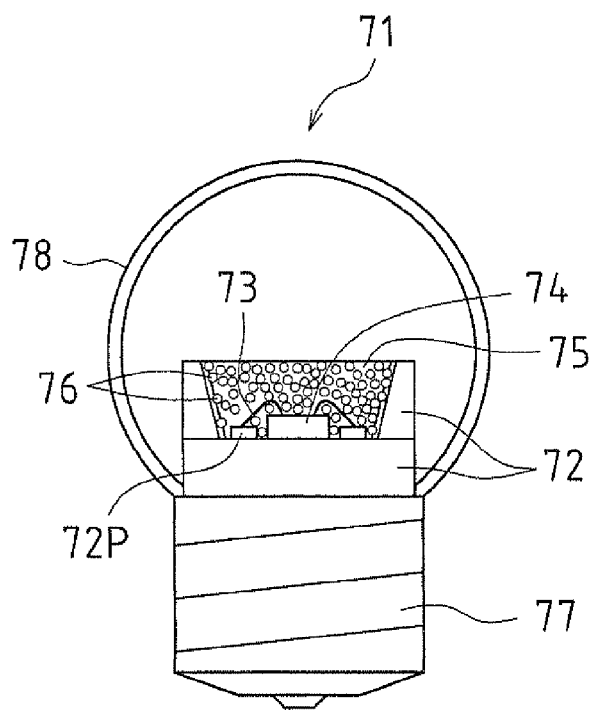
FIG. 9 is a longitudinal sectional view showing a light-emitting device according to an eighth embodiment of the present invention.

FIG. 9 is a longitudinal sectional view showing a light-emitting device according to an eighth embodiment of the present invention. As shown in FIG. 9, the light-emitting device 71 of the eighth embodiment includes a substrate 72, a semiconductor light-emitting element 74 mounted on the substrate 72, a translucent sealing resin 75 sealing the semiconductor light-emitting element 74 on the substrate 72, a base 77 supporting the substrate 72, and a translucent cover 78 covering the space above the base 77.

As the substrate 72, a polyphthalamide (PPA) resin package substrate formed in one piece with a lead frame is used. The substrate 72, which has a recessed portion on its upper side, has a size of for example 3.2 mm×2.8 mm length by width, with a thickness of 1.0 mm.

The semiconductor light-emitting element 74 is die-bonded with die-bonding paste onto the substrate 72 and connected by bondwires 73 to a wiring pattern 72P. This wiring pattern 72P is connected to a lead frame (not shown in the figures) formed on the substrate 72. The semiconductor light-emitting element 74 is a blue light-emitting element having its main light emission peak in the blue wavelength region between 400 nm and 500 nm, for example.

The polyphthalamide (PPA) resin serving as the material of the substrate 72 deteriorates when it is subjected to the light or heat from the semiconductor light-emitting element 74, and when the total time it has been subjected to this light or heat reaches about 40,000 hours, the color of the substrate 72 changes from colorless transparent to yellowish brown.

The translucent sealing resin 75 has a thickness of about 0.5 mm and is made by injecting dimethyl silicone into the recessed portion of the substrate 72 and curing it.

The translucent sealing resin 75 contains a fluorescent material 76. Here, the fluorescent material 76 is a divalent europium-activated oxynitride yellow fluorescent material, which is an α-SiAlON that can be substantially represented by the general formula (C): $MIII_g Eu_h Si_i Al_j O_k N_l$ (where MIII represents at least one alkaline earth metal element selected from Mg, Ca, Sr, and Ba). This yellow fluorescent material absorbs blue light emitted from the semiconductor light-emitting element 74, and emits yellow light having an emission peak in a wavelength region between 550 nm and 600 nm. The light-emitting device 71 emits white light obtained by mixing the blue light and the yellow light.

In this manner, a chip LED, in which the semiconductor light-emitting element 74 is mounted on the substrate 72, is mounted on the base 77, and the translucent cover 78 is attached to the base 77.

The process for manufacturing such a light-emitting device 71 is similar to that for the light-emitting device 11 of FIG. 1A. A plurality of semiconductor light-emitting elements 74 are mounted by die-bonding in an array arrangement on a large substrate. Then, dimethyl silicone (into which the fluorescent material 76 has been kneaded) is injected by air dispension and cured, the translucent sealing resin 75 is formed. Then, the large substrate is diced, and cut into a plurality of substrates 72, each having a semiconductor light-emitting element 74 mounted on them, thus forming a plurality of chip LEDs. A chip LED is mounted on the base 77, the translucent cover 78 is molded with a die and at the same time, the upper edge of the base 77 is connected to the aperture portion of the translucent cover 78, thus completing the light-emitting device 71.

In this light-emitting device 71, as mentioned above, the substrate 72 is made of a polyphthalamide (PPA) resin whose color changes from colorless transparent to yellowish brown when it is subjected to light or heat from the semiconductor light-emitting element 74. When the total time for which the substrate 72 is subjected to light or heat reaches about 40,000 hours, which is less than the predetermined time of the lifetime of the semiconductor light-emitting element 74, the color of the substrate 72 changes from colorless transparent to yellowish brown. The semiconductor light-emitting element 74 is mounted in the recessed portion of the substrate 72, and a portion of the light of the semiconductor light-emitting element 74 passes through the lateral walls of the recessed portion of the substrate 72, so that due to the change in color of the substrate 72, the brightness of the light-emitting device 71 decreases and the emission color changes, making it possible to indicate that the lifetime of the semiconductor light-emitting element 74 has come.

Moreover, it is possible to indicate the lifetime of the semiconductor light-emitting element 74 through a simple selection of the material of the substrate 72, without a large increase in costs. Furthermore, if a plurality of light-emitting devices 71 are used, it is possible to indicate the lifetimes of the semiconductor light-emitting elements 74 individually, since the substrate 72 is provided separately for each semiconductor light-emitting element 74.

Similar to the primer 69 of FIG. 8, the polyphthalamide (PPA) resin serving as the substrate 72 deteriorates due to the heat generated by the semiconductor light-emitting element, and as the heat increases, the quicker the rate by which the deterioration advances becomes. On the other hand, the lifetime of the semiconductor light-emitting element 74 becomes shorter the larger the current becomes. Consequently, it seems that the lifetimes of the semiconductor light-emitting element 74 and the substrate 72 near the semiconductor light-emitting element 74 correlate with each other. In illumination devices in which many chip LEDs are mounted, even when there is a variation between the current amounts flowing through the chip LEDs (variation in the lifetime), the substrate 72 and the semiconductor light-emitting element 74 deteriorate together in accordance with the current amount, so that it is possible to indicate the lifetime of the semiconductor light-emitting element 74 through the deterioration of the substrate 72 for each chip LED individually. That is to say, even when there are differences in the lifetime due to differences in the individual properties of the semiconductor light-emitting elements 74, it is possible to indicate the lifetimes of the various semiconductor light-emitting elements 74 individually.

It is also possible to apply a primer that deteriorates as it is subjected to the heat from the semiconductor light-emitting element 74 between the substrate 72 and the translucent sealing resin 75. When this primer deteriorates and detaches from the substrate 72, the translucent sealing resin 75 falls off together with the primer, and the bondwires 73 contained in the translucent sealing resin 75 are broken off, so that the semiconductor light-emitting element 74 stops emitting light and the lifetime of the semiconductor light-emitting element 74 is reliably indicated.

Alternatively, the translucent sealing resin 75 casts a shadow against the translucent cover 78, which is easy to confirm visually, or, when the light-emitting device 71 is shaken, it emits a noise of the collision of the translucent sealing resin 75 within the translucent cover 78, thus indicating the lifetime of the semiconductor light-emitting element 74.

Also when only a portion of the translucent sealing resin 75 detaches, the luminosity of the light-emitting device 71 decreases considerably, so that it can be indicated that the lifetime of the semiconductor light-emitting element 74 has come.

It is also possible that at least a portion of the base 77 and the substrate 72 are made of the same material, so that when at least this portion of the base 77 is subjected to heat from the semiconductor light-emitting element 74, its color changes.

Furthermore, one semiconductor light-emitting element 74 is mounted on one substrate 72, but it is also possible to mount a plurality of semiconductor light-emitting elements 74, or to mount a plurality of chip LEDs on one base 77.

Furthermore, if a semiconductor light-emitting element that emits ultraviolet light is used, then the substrate 72 or the base 77 may also contain a photocatalyst such as titanium oxide. Due to the photocatalytic action of the ultraviolet light rays with the titanium oxide, the resin of the substrate 72 or the base 77 dissolves and deteriorates. Thus, it is possible to determine the lifetime.

Ninth Embodiment

Figure 10:
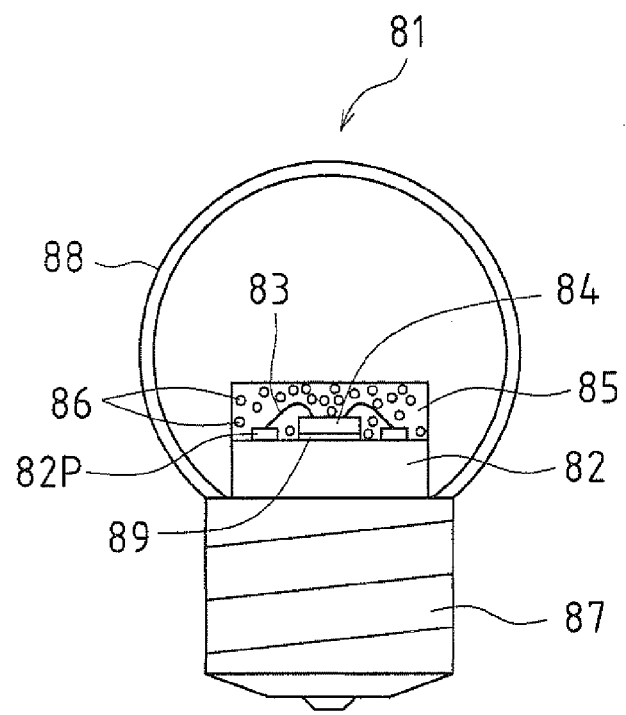
FIG. 10 is a longitudinal sectional view showing a light-emitting device according to a ninth embodiment of the present invention.
Figure 11A:
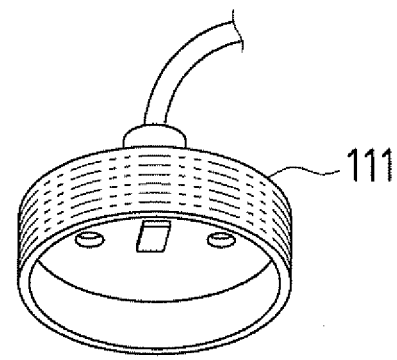
FIG. 11A is an exploded perspective view showing a conventional device as viewed obliquely from below.
Figure 11A:
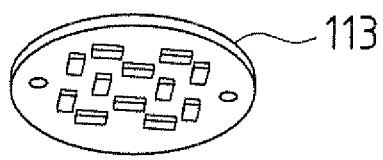
Figure 11A:
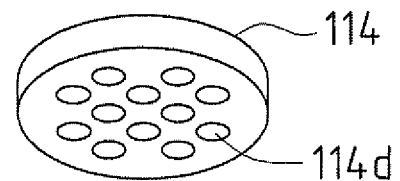
Figure 11A:
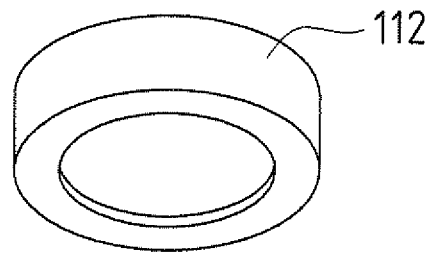
Figure 11B:
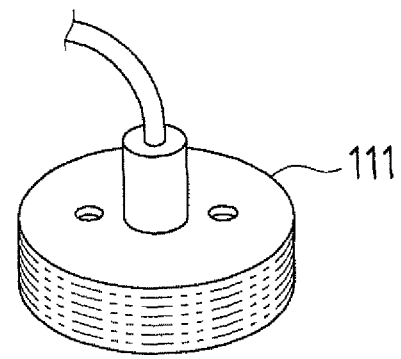
FIG. 11B is an exploded perspective view showing the conventional device in FIG. 11A as viewed obliquely from above.
Figure 11B:
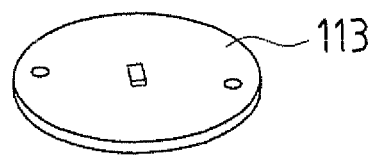
Figure 11B:
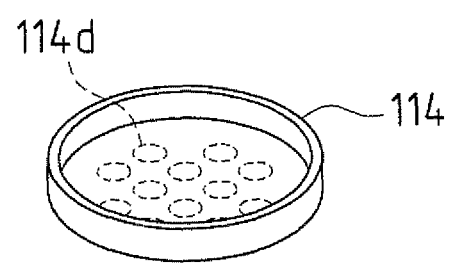
Figure 11B:
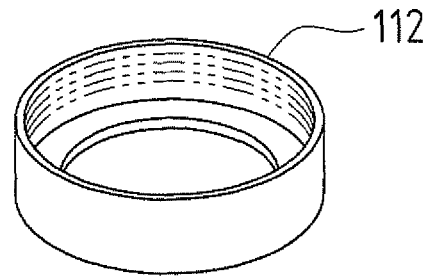
Figure 12A:
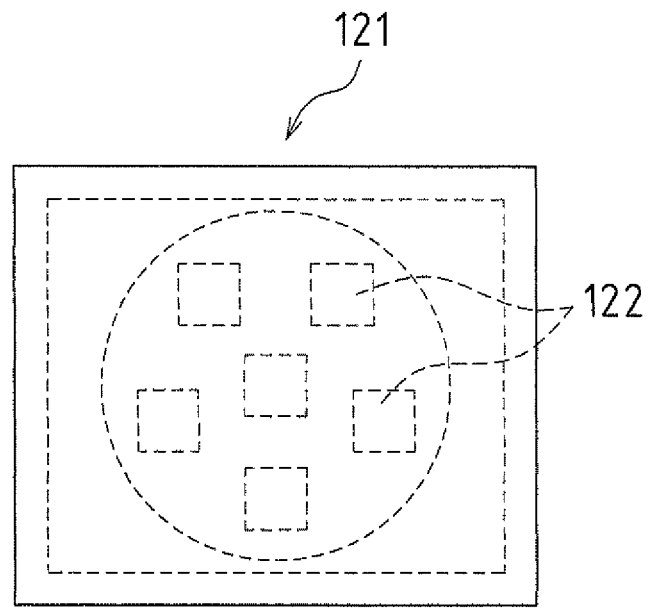
FIG. 12A is a plan view showing another conventional device.
Figure 12B:
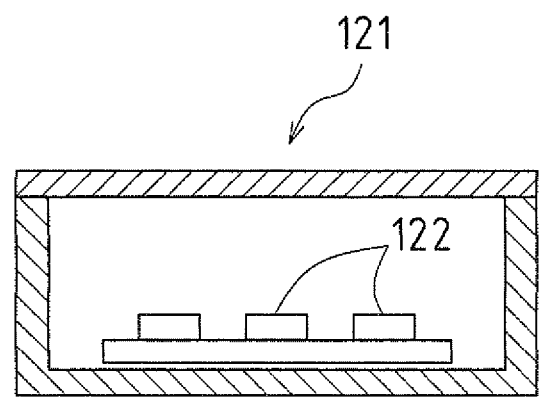
FIG. 12B is a cross-sectional view showing another conventional device.

FIG. 10 is a longitudinal sectional view showing a light-emitting device according to a ninth embodiment of the present invention.

As shown in FIG. 10, a light-emitting device 81 of the ninth embodiment includes a substrate 82, a semiconductor light-emitting element 84 mounted on the substrate 82, a translucent sealing resin 85 sealing the semiconductor light-emitting element 84 on the substrate 82, a base 87 supporting the substrate 82, and a translucent cover 88 covering the space above the base 87.

The semiconductor light-emitting element 84 is die-bonded with die-bonding paste 89 on the substrate 82 and connected by bondwires 83 to a wiring pattern 82P formed on the substrate 82.

The die-bonding paste 89 is made of a polyimide resin, which deteriorates when it is subjected to light or heat from the semiconductor light-emitting element 84, and when the total time it has been subjected to this light or heat reaches about 40,000 hours, the color of the die-bonding paste 89 changes from colorless transparent to dark brown, and it detaches from the substrate 82.

The translucent sealing resin 85 absorbs light that is emitted from the semiconductor light-emitting element 84 and includes a fluorescent material 86 that emits fluorescent light.

In this manner, a chip LED, in which the semiconductor light-emitting element 84 is mounted on the substrate 82, is mounted on the base 87, and the translucent cover 88 is attached to the base 87.

In this light-emitting device 81, when the time for which the die-bonding paste 89 is subjected to light or heat from the semiconductor light-emitting element 84 reaches about 40,000 hours, which is less than the predetermined time of the lifetime of the semiconductor light-emitting element 84, the color of the die-bonding paste 89 changes from colorless transparent to dark brown. Thus, it is possible to indicate that the lifetime of the semiconductor light-emitting element 84 has come.

Moreover, it is possible to indicate the lifetime of the semiconductor light-emitting element 84 through a simple selection of the material of the die-bonding paste 89, without a large increase in costs. Furthermore, if a plurality of light-emitting devices 81 are used, it is possible to indicate the lifetimes of the semiconductor light-emitting elements 84 individually, since the substrate 82 is provided separately for each semiconductor light-emitting element 84.

In the foregoing, preferable embodiments of the present invention have been explained with reference to the accompanying drawings, but needless to say, the present invention is not limited to these examples. Within the scope of the claims, various modifications and improvements will be apparent to the person skilled in the art, and these should be understood to be within the technical scope of the present invention.

For example, it is possible to combine the structural elements of the various embodiments as appropriate. Furthermore, it is also possible to change some of the processing materials in the methods for manufacturing a light-emitting device, or to make it possible to indicate the lifetime or the exchange timing of the semiconductor light-emitting element by simply adding process steps. That is to say, when using a plurality of semiconductor light-emitting elements for the illumination device or the like, it is possible to determine the individual lifetimes easily and at low cost, without necessitating specific circuitry or devices.

Furthermore, as a material whose color, transparency or adhesiveness changes over time as it is subjected to light or heat from the semiconductor light-emitting element, there are for example epoxy resin, acrylic resin, imide resin, phenolic resin, silicone resin, norbornene resin, polymethyl pentene resin, amorphous nylon resin, polyarylate and polycarbonate resin, so that it is possible to apply one or several of them in combination as appropriate.

The present invention can be carried out in other various forms without departing from the spirit or essential characteristics thereof. The above embodiments are therefore to be taken in all respects as exemplary only, and are not to be interpreted as being limiting. The present invention is represented by the appended claims and is not restricted in any way to the specification itself. Furthermore, all variations and modifications falling within the scope of the claims also fall within the scope of the present invention.

What is claimed is:

1. A light-emitting device comprising:
   a semiconductor light-emitting element;
   a translucent cover spaced apart from and substantially covering said semiconductor light emitting element with an empty space between the translucent cover and the semiconductor light-emitting element; and
   a peripheral member disposed only on a portion of an inner surface or an outer surface of the translucent cover and being made using a material whose color, transparency or adhesiveness changes over time as it is subjected to light or heat emitted by the semiconductor light-emitting element.

2. The light-emitting device according to claim 1, further comprising an encapsulant in contact with and encasing the semiconductor light-emitting element.

3. The light emitting device according to claim 2, wherein said peripheral member is disposed so as to be spaced apart from said encapsulant.

4. The light-emitting device according to claim 1, wherein there is a difference in the change over time in color, transparency or adhesiveness due to the light or heat emitted by the semiconductor light-emitting element, between the peripheral member and the translucent cover.

5. The light-emitting device according to claim 1, wherein a time after which the color, transparency or adhesiveness of the peripheral member changes is shorter than a lifetime of the semiconductor light-emitting element.

6. The light-emitting device according to claim 4, wherein the time after which the color, transparency or adhesiveness of the peripheral member changes is in the range of about 20,000 to 150,000 hours.

7. The light-emitting device according to claim 1, wherein the peripheral member is arranged on an optical axis of the semiconductor light-emitting element.

8. The light-emitting device according to claim 1, wherein the peripheral member is made of at least one selected from the group consisting of epoxy resin, acrylic resin, imide resin, phenolic resin, silicone resin, norborene resin, polymethyl pentene resin, amorphous nylon resin, polyarylate and polycarbonate resin.

9. The light-emitting device according to claim 1, wherein the color, transparency or adhesiveness of the peripheral member changes over time due to photocatalytic action caused by the light emitted by the semiconductor light-emitting element.

10. The light-emitting device according to claim 1, wherein the semiconductor light-emitting element is an LED whose emission color is blue or violet.

11. The light-emitting device according to claim 1, wherein the adhesiveness of the peripheral member deteriorates due to the change over time, and the peripheral member detaches and falls off inside the translucent cover.

12. The light-emitting device according to claim 1, wherein the adhesiveness of the peripheral member deteriorates due to the change over time, and the peripheral member detaches and falls off of the translucent cover.

* * * * *